(12) United States Patent
Jeon

(10) Patent No.: US 9,354,480 B2
(45) Date of Patent: May 31, 2016

(54) ARRAY SUBSTRATE AND LIQUID CRYSTAL DISPLAY PANEL HAVING A NEW PIXEL STRUCTURE CAPABLE OF IMPROVING LUMINANCE AND WHITE BALANCE WHILE PROVIDING A WIDER VIEWING ANGLE

(71) Applicant: SAMSUNG DISPLAY CO., LTD., Yongin, Gyeonggi-do (KR)

(72) Inventor: Mu-Kyung Jeon, Ulsan (KR)

(73) Assignee: Samsung Display Co., Ltd., Yongin-si (KR)

( * ) Notice: Subject to any disclaimer, the term of this patent is extended or adjusted under 35 U.S.C. 154(b) by 77 days.

(21) Appl. No.: 14/490,485

(22) Filed: Sep. 18, 2014

(65) Prior Publication Data

US 2015/0092135 A1 Apr. 2, 2015

(30) Foreign Application Priority Data

Sep. 30, 2013 (KR) ........................ 10-2013-0116152

(51) Int. Cl.
  *G02F 1/1368* (2006.01)
  *G02F 1/1362* (2006.01)
  *H01L 27/12* (2006.01)
  *G02F 1/1343* (2006.01)

(52) U.S. Cl.
  CPC .... *G02F 1/136286* (2013.01); *G02F 1/134309* (2013.01); *H01L 27/124* (2013.01)

(58) Field of Classification Search
  CPC .............. G02F 2001/133638; G02F 1/136286; G02F 1/134309; H04N 13/0404; H04N 13/0409; H04N 13/0402; H01L 27/124
  USPC .......................................................... 349/141
  See application file for complete search history.

(56) References Cited

U.S. PATENT DOCUMENTS

| 8,659,523 | B2* | 2/2014 | Osame | H04M 1/0266 |
| | | | | 257/59 |
| 9,110,339 | B2* | 8/2015 | Huang | G02F 1/134309 |
| 9,164,340 | B2* | 10/2015 | Chen | G02F 1/136286 |

FOREIGN PATENT DOCUMENTS

KR 10-2009-0120772 A 11/2009

* cited by examiner

*Primary Examiner* — Tracie Y Green
(74) *Attorney, Agent, or Firm* — Lewis Roca Rothgerber Christie LLP

(57) ABSTRACT

An array substrate includes a unit pixel group having first and second sub-pixel rows. The array substrate includes a plurality of gate lines extending along a first direction and adjacent to each other on a base substrate, a plurality of gate electrodes electrically coupled to the gate lines, a plurality of semiconductor patterns overlapping the gate electrodes, a plurality of data lines extending along a second direction and electrically coupled to first portions of the semiconductor patterns, a plurality of drain electrode patterns electrically coupled to second portions of the semiconductor patterns, and a plurality of pixel electrodes electrically coupled to the drain electrodes. The second portion of the semiconductor pattern spaced from the first portion thereof. The gate lines and the data lines are bent. Sub-pixels in the first sub-pixel row have opening areas that are different in size than that of sub-pixels in the second sub-pixel row.

20 Claims, 25 Drawing Sheets

FIG. 1
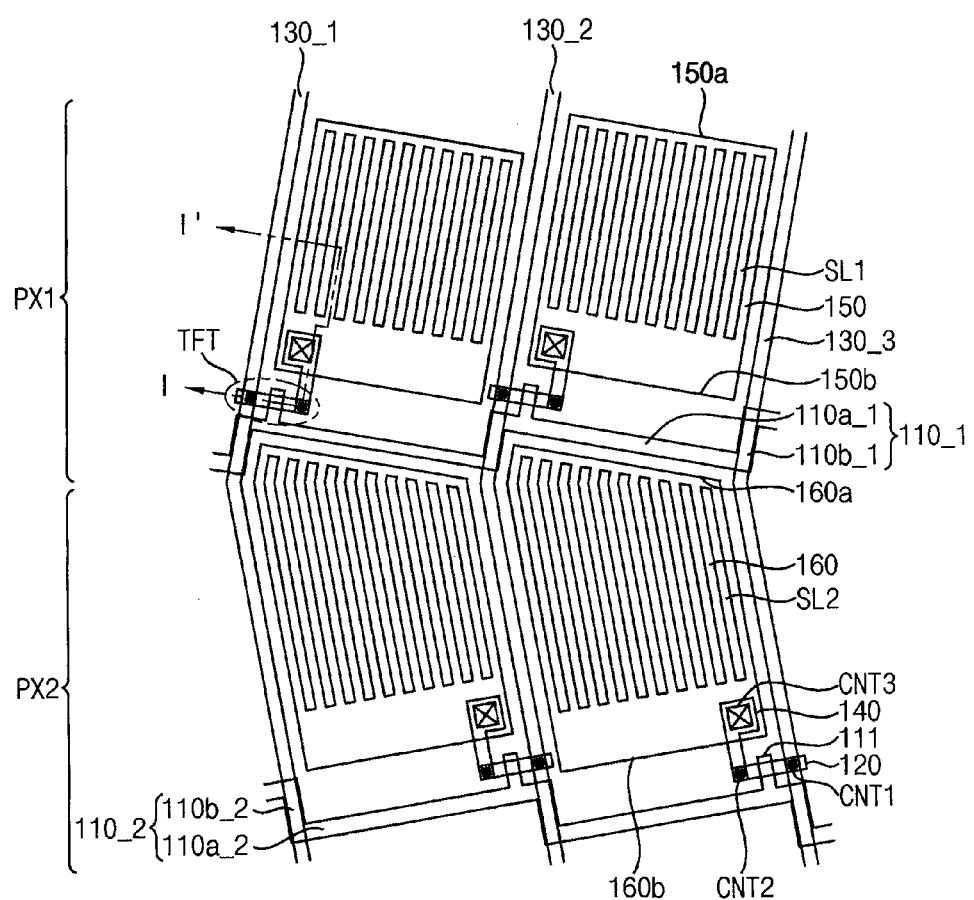
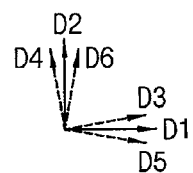

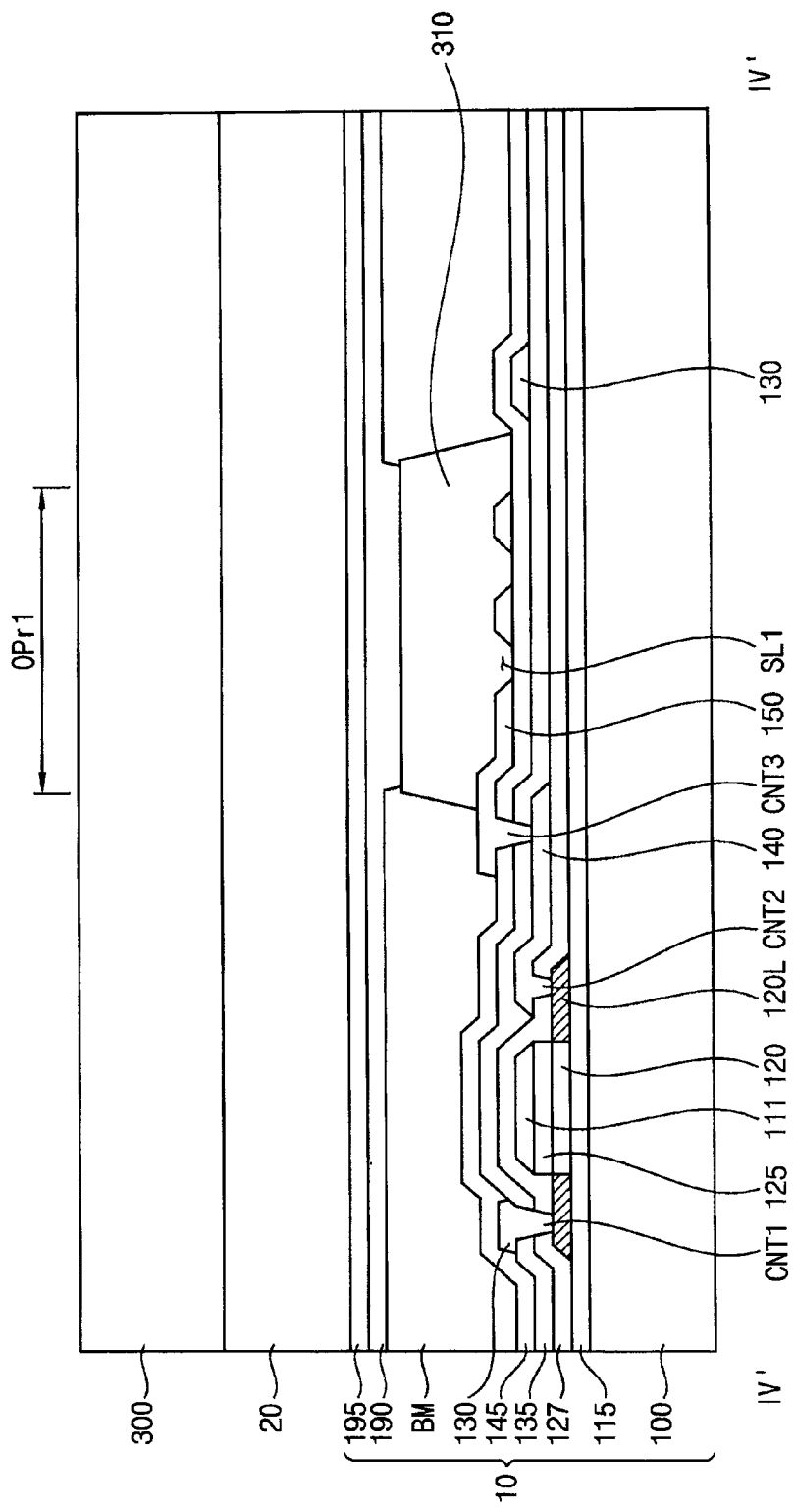

ARRAY SUBSTRATE AND LIQUID CRYSTAL DISPLAY PANEL HAVING A NEW PIXEL STRUCTURE CAPABLE OF IMPROVING LUMINANCE AND WHITE BALANCE WHILE PROVIDING A WIDER VIEWING ANGLE

CROSS-REFERENCE TO RELATED APPLICATION

This application claims priority to and the benefit of Korean Patent Application No. 10-2013-0116152, filed on Sep. 30, 2013 in the Korean Intellectual Property Office, the content of which is incorporated herein by reference.

BACKGROUND

1. Field

Aspects of embodiments of the invention are directed toward an array substrate and a liquid crystal display panel having the same.

2. Description of the Related Art

A liquid crystal display panel may include an array substrate, an opposing substrate, and a liquid crystal display layer. Control signals of a plurality of pixel electrodes may be applied to the array substrate through signal lines. The opposing substrate may face the array substrate. The liquid crystal display layer may be disposed between the array substrate and the opposing substrate. Arrangements of liquid crystals in the liquid crystal layer may be adjusted or varied by an electric field generated by the control signals.

Technologies have been developed to narrow a gap between the signal lines in order to implement ultra-high definition displays in the liquid crystal display panel. For example, a data line applying a data voltage to one of the pixel electrodes may be spaced from a drain electrode by about 2 μm to about 3 μm. The drain electrode may be electrically coupled to (e.g., electrically connected to) the one of the pixel electrodes through a contact hole. Accordingly, a display resolution of about 800 pixels per inch (ppi) may be implemented in the liquid crystal display panel. However, it is difficult to reduce the gap between the data line and the drain electrode beyond about 2 μm to implement higher display resolutions due to a spatial limit in a manufacturing process.

Also, each of the pixel electrodes may include a plurality of domains in order to widen a viewing angle of the liquid crystal display panel. However, luminance at a boundary of the domains may decrease in a pixel region due to a difference between electric field directions generated in the domains.

Accordingly, aspects of embodiments of the present invention are directed toward a new pixel structure capable of improving luminance and white balance of the liquid crystal display panel while providing a wider viewing angle.

SUMMARY

Aspects of embodiments of the invention are directed toward an array substrate capable of implementing ultra-high definition display and improving luminance and white balance.

Also, aspects of embodiments of the invention are directed toward a liquid crystal display panel having the array substrate.

In an example embodiment according to the invention, the array substrate includes a unit pixel group having a first sub-pixel row and a second sub-pixel row adjacent to the first sub-pixel row. The array substrate includes a plurality of gate lines extending along a first direction and adjacent to each other on a base substrate, a plurality of gate electrodes electrically coupled to the gate lines, respectively, a plurality of semiconductor patterns overlapping the gate electrodes, respectively, a plurality of data lines extending along a second direction and electrically coupled to first portions of the semiconductor patterns, respectively, a plurality of drain electrode patterns electrically coupled to second portions of the semiconductor patterns, respectively, and a plurality of pixel electrodes electrically coupled to the drain electrodes, respectively. The second direction crosses the first direction. The second portion of the semiconductor pattern is spaced from the first portion of the semiconductor pattern. Each of the gate lines and each of the data lines are bent. Sub-pixels in the first sub-pixel row have opening areas that are different in size than that of sub-pixels in the second sub-pixel row.

In an example embodiment, the semiconductor patterns may include a poly-crystalline silicon material.

In an example embodiment, the second direction may be substantially perpendicular to the first direction. The gate lines may include a first gate line extending along the first direction in a first zigzag shape and a second gate line extending along the first direction in a second zigzag shape. The second zigzag shape may be substantially symmetrical to the first zigzag shape with respect to the second direction.

In an example embodiment, the first gate line may include a first inclined portion extending along a third direction tilted from the first direction and a first connecting portion connected to the first inclined portion. The second gate line may include a second inclined portion extending along a fourth direction tilted from the first direction and a second connecting portion connected to the second inclined portion. The fourth direction may be opposite to (e.g., mirror or have reflection symmetry to) the third direction with respect to the first direction.

In an example embodiment, the pixel electrodes in the first sub-pixel row may be electrically coupled to the data lines at a first side along the first direction. The pixel electrodes in the second sub-pixel row may be electrically coupled to the data lines at a second side along the first direction. The second side may be opposite to the first side with respect to the second direction.

In an example embodiment, the data lines in the first sub-pixel row may extend along a fifth direction tilted from the second direction, and the data lines in the second sub-pixel row may extend along a sixth direction tilted from the second direction. The sixth direction may be opposite to the fifth direction with respect to the first direction.

In an example embodiment, the drain electrode patterns may be in layers different than layers the data lines are in.

In an example embodiment, the unit pixel may further include an insulation layer between the drain electrode patterns and the data lines.

In an example embodiment, the insulation layer may cover the drain electrode patterns. The data lines may contact the first portions of the semiconductor patterns through first contact openings in the insulation layer, respectively.

In an example embodiment, the insulation layer may cover the data lines. The drain electrode patterns may contact the second portions of the semiconductor patterns through second contact openings in the insulation layer, respectively.

In an example embodiment, the pixel electrodes may include a plurality of slit portions, the slit portions in the first sub-pixel extend along a direction different than a direction along which the slit portions in the second sub-pixel row extend.

In an example embodiment according to the invention, the liquid crystal display panel includes an array substrate including a unit pixel group including a first sub-pixel row and a second sub-pixel row adjacent to the first sub-pixel row. The array substrate includes a plurality of gate lines extending along a first direction and adjacent to each other on a base substrate, a plurality of gate electrodes electrically coupled to the gate lines, respectively, a plurality of semiconductor patterns overlapping the gate electrodes, respectively, a plurality of data lines extending along a second direction and electrically coupled to first portions of the semiconductor patterns, respectively, a plurality of drain electrode patterns electrically coupled to second portions of the semiconductor patterns, respectively, and a plurality of pixel electrodes electrically coupled to the drain electrodes, respectively, an opposing substrate facing the array substrate, and a liquid crystal layer between the array substrate and the opposing substrate. The second direction crossing the first direction. The second portions of the semiconductor patterns being spaced from the first portions of the respective semiconductor patterns. Each of the gate lines and each of the data lines are bent. Sub-pixels in the first sub-pixel row have opening areas that are different in size than that of sub-pixels in the second sub-pixel row.

In an example embodiment, the second direction may be substantially perpendicular to the first direction. The gate lines may include a first gate line extending along the first direction in a first zigzag shape and a second gate line extending along the first direction in a second zigzag shape. The second zigzag shape may be substantially symmetrical to the first zigzag shape with respect to the second direction.

In an example embodiment, the liquid crystal display panel may further include a plurality of color filter patterns overlapping the pixel electrodes, respectively, and a light blocking pattern overlapping the gate lines, the gate electrodes, the semiconductor patterns, and the data lines.

In an example embodiment, the light blocking pattern may include a plurality of opening regions overlapping the pixel electrodes respectively. Areas of at least two of the opening regions may be different from each other.

In an example embodiment, the color filter patterns may include a red filter pattern, a green filter pattern, and a blue filter pattern.

In an example embodiment, the color filter patterns may have one of an RGB stripe format or an PenTile format The opening region corresponding to the blue filter pattern may be greater in size than that of each of the red filter pattern and the green filter pattern.

In an example embodiment, the color filter patterns may have the PenTile format. The pixel electrodes may include first and second pixel electrodes in the first sub-pixel row arranged along the first direction and third and fourth pixel electrodes in the second sub-pixel row arranged along the first direction. At least one of the third pixel electrode and the fourth pixel electrode may be greater in size than that of each of the first pixel electrode and the second pixel electrode.

In an example embodiment, the color filter patterns may have the RGB stripe format. The pixel electrodes may include first, second, and third pixel electrodes in the first sub-pixel row arranged along the first direction and fourth, fifth, and sixth pixel electrodes in the second sub-pixel row arranged along the first direction. At least one of the third pixel electrode and the sixth pixel electrode may be greater in size than that of each of the first, second, fourth, and fifth pixel electrodes.

In an example embodiment, the color filter patterns and the light blocking pattern may be on the array substrate.

According to one or more example embodiments of the present invention, the unit pixel group arranged in a matrix shape may include the data line and the gate line extending in a zigzag shape with respect to an arrangement direction of the unit pixel group, thereby providing a wider viewing angle.

Also, the data line may be disposed in a layer different from that of the drain electrode pattern, thereby reducing the gap (e.g., the horizontal gap) between the data line and the drain electrode pattern and increasing a display resolution of the liquid crystal display panel.

Also, opening areas of the sub-pixel parts divided by one of the data lines or gate lines may have sizes that are different from each other in the unit pixel group, thereby reducing a luminance decrease generated at boundaries between the sub-pixel parts.

Furthermore, one of the sub-pixel parts transmitting a first color light may be larger than that of another sub-pixel part transmitting a second color light different from the first color light in an opening area, thereby improving luminance and white balance of the liquid crystal display panel.

BRIEF DESCRIPTION OF THE DRAWINGS

The above and other features and advantages of the invention will become more apparent by describing in detail example embodiments thereof with reference to the accompanying drawings, in which:

FIG. 1 is a plan view illustrating an array substrate according to an example embodiment of the invention;

FIG. 11 is a cross-sectional view taken along the line IV-IV' of FIG. 10; and

DETAILED DESCRIPTION

Figure 2:
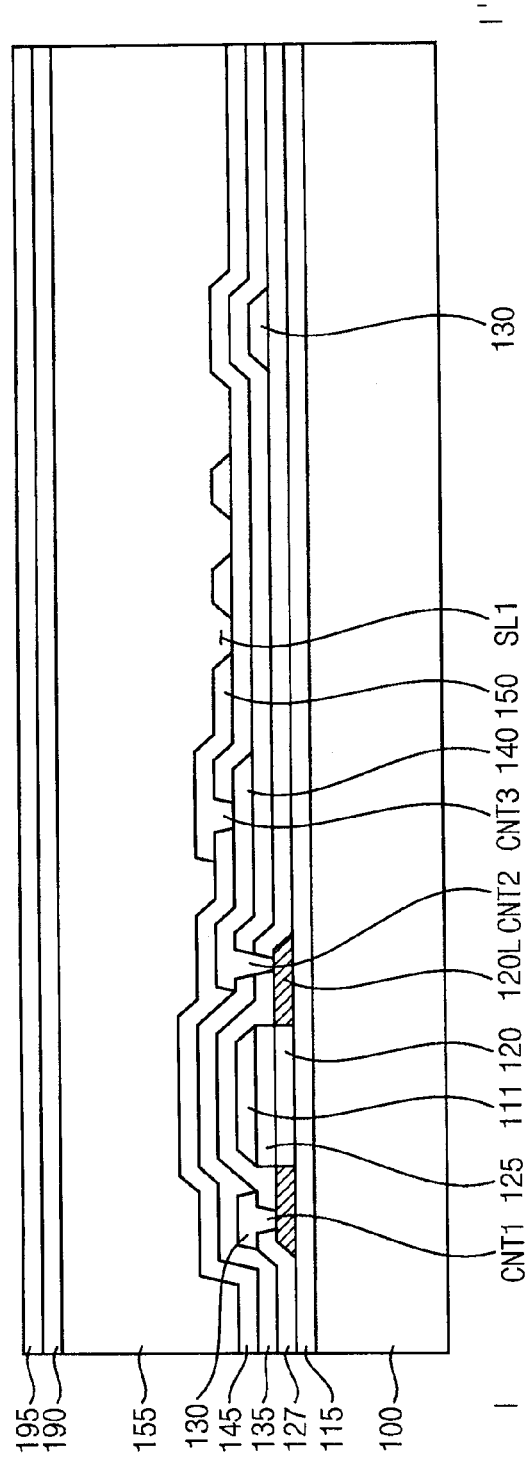
FIG. 2 is a cross-sectional view taken along the line I-I' of FIG. 1.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

Example embodiments of the present invention will be described below in more detail with reference to the accompanying drawings. Throughout the disclosure, like reference numerals refer to like parts, and a redundant description thereof may be omitted.

It will be understood that although the terms "first", "second", etc. may be used herein to describe various components, these components should not be limited by these terms. These components are only used to distinguish one component from another.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it may be directly or indirectly formed on the other layer, region, or component. That is, for example, one or more intervening layers, regions, or components may also be present.

Sizes of elements in the drawings may be exaggerated for convenience of explanation. In other words, because sizes and thicknesses of components in the drawings are arbitrarily illustrated for convenience of explanation, the following embodiments are not limited thereto. Expressions such as "at least one of," when preceding a list of elements, modify the entire list of elements and do not modify the individual elements of the list. Further, the use of "may" when describing embodiments of the present invention relate to "one or more embodiments of the present invention."

FIG. 1 is a plan view illustrating an array substrate according to an example embodiment of the invention. FIG. 2 is a cross-sectional view taken along the line I-I' of FIG. 1.

Referring to FIG. 1 and FIG. 2, an array substrate according to the present example embodiment includes a unit pixel group arranged in a matrix shape along a first direction D1 and a second direction D2 crossing (e.g., substantially perpendicular to) the first direction D1. The unit pixel group includes a plurality of sub-pixel parts disposed in a first sub-pixel row PX1 and in a second sub-pixel row PX2 adjacent to the first sub-pixel row PX1. For example, the unit pixel group may include two sub-pixel parts in the first sub-pixel row PX1 and in the second sub-pixel row PX2, respectively. Although the unit pixel group shown in FIG. 1 includes two sub-pixel parts in each of the first sub-pixel row PX1 and the second sub-pixel row PX2, the number of sub-pixel parts of the unit pixel group is not limited thereto. Hereinafter, the two sub-pixel parts sequentially disposed (e.g., arranged) in the first sub-pixel row PX1 along the first direction D1 are referred as a first sub-pixel part and a second sub-pixel part. Also, the two sub-pixel parts sequentially disposed (e.g., arranged) in the second sub-pixel row PX2 along the first direction D1 are referred as a third sub-pixel part and a fourth sub-pixel part.

The array substrate may include a first base substrate 100, a buffer layer 115, a gate line 110, a data line 130, a first insulation layer 125, a second insulation layer 127, a third insulation layer 135, a thin film transistor TFT, a passivation layer 145, pixel electrodes 150 and 160, an organic insulation layer 155, a common electrode 190, and a protection layer 195. The thin film transistor TFT may include a semiconductor pattern 120, a gate electrode 111, and a drain electrode pattern 140.

The first base substrate 100 may include a transparent insulation material. For example, the first base substrate 100 may include glass, quartz, plastic, polyethylene terephthalate (PET) resin, polyethylene (PE) resin, polycarbonate (PC) resin, etc.

The buffer layer 115 may be disposed on the first base substrate 100. The buffer layer 115 may prevent diffusion of impure materials or elements from the first base substrate 100. The buffer layer 115 may have a flat or planar surface. The buffer layer 115 may include, for example, a silicon compound. For example, the buffer layer 115 may include silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), etc.

The semiconductor pattern 120 may be disposed on the buffer layer 115. The semiconductor pattern 120 may include, for example, a poly-crystalline silicon material. The poly-crystalline silicon material may be formed by a dehydrogenation process of an amorphous silicon material and a subsequent crystallization process. For example, the poly-crystalline silicon material may be formed by a low temperature poly-silicon ("LTPS") process which is conducted at a temperature greater than about 300 degrees Celsius.

The first insulation layer 125 may be disposed on the first base substrate 100 on which the semiconductor pattern 120 is disposed. The first insulation layer 125 may be disposed at a channel region between lightly doped drain regions 120L of the semiconductor pattern 120. The first insulation layer 125 may include, for example, an inorganic material. For example, the first insulation layer 125 may include silicon oxide, silicon nitride, etc.

The gate line 110 may include a first gate line 110_1 electrically coupled to (e.g., electrically connected to) first pixel electrodes 150 disposed in the first sub-pixel row PX1 and a second gate line 110_2 electrically coupled to (e.g., electrically connected to) second pixel electrodes 160 disposed in the second sub-pixel row PX2. The first gate line 110_1 may include a first inclined portion 110a_1 partially extending along a fifth direction D5 tilted in a clockwise direction with respect to the first direction D1 and a first connecting portion 110b_1 partially extending along a sixth direction D6 crossing (e.g., substantially perpendicular to) the fifth direction D5. The first inclined portion 110a_1 and the first connecting portion 110b_1 may together have a first zigzag shape. The first connecting portion 110b_1 may overlap the data line 130. The second gate line 110_2 may include a second inclined portion 110a_2 partially extending along a third direction D3 tilted in a counterclockwise direction with respect to the first direction D1 and a second connecting portion 110b_2 partially extending along a fourth direction D4 crossing (e.g., substantially perpendicular to) the third direction D3. The second inclined portion 110a_2 and the second connecting portion 110b_2 may together have a second zigzag shape. The second connecting portion 110b_2 may overlap the data line 130. In the present embodiment, the first zigzag shape and the second zigzag shape may be substantially symmetrical with respect to an axis along the first direction D1. For example, the first gate line 110_1 and the second gate line 110_2 may have zigzag shapes substantially symmetrical to each other and may each extend along the first direction D1.

Gate on/off voltages may be applied to the gate line 110 from a gate driving part. The gate line 110 may include, for example, aluminum (Al), gold (Au), silver (Ag), copper (Cu), iron (Fe), nickel (Ni), etc. These may be used alone or in a mixture thereof. The gate line 110 may include, for example, indium doped zinc oxide (IZO), gallium doped zinc oxide (GZO), etc.

The gate electrode 111 may be electrically coupled to (e.g., electrically connected to) the gate line 110. The gate electrode 111 may include, for example, the same material as the gate line 110. For example, the gate electrode 111 may be integrally formed with the gate line 110. For example, the gate electrode 111 may protrude along the sixth direction D6 from the first inclined portion 110a_1 in the first sub-pixel row PX1. For example, the gate electrode 111 may protrude along the fourth direction D4 from the second inclined portion 110a_2 in the second sub-pixel row PX2.

The second insulation layer 127 may be disposed on the first base substrate 100 on which the gate electrode 111 is disposed. The second insulation layer 127 may include, for example, the same material as the first insulation layer 125.

The data line 130 may be disposed on the second insulation layer 127. The data line 130 may be electrically coupled to (e.g., electrically connected to) the semiconductor pattern 120 through a first contact opening CNT1 (e.g., a first contact hole) defined in the first insulation layer 125 and the second insulation layer 127. The data line 130 may include a first data line 130_1, a second data line 130_2, and a third data line 130_3 disposed (e.g., sequentially disposed) along the first direction D1. The first data line 130_1, the second data line 130_2, and the third data line 130_3 may be bent or curved at or between the unit pixel groups, respectively. For example, the first data line 130_1, the second data line 130_2, and the third data line 130_3 may extend along the sixth direction D6 in the first sub-pixel row PX1 and may extend along the fourth direction D4 in the second sub-pixel row PX2, respectively. For example, the first data line 130_1, the second data line 130_2, and the third data line 130_3 may be bent or curved to be parallel with each other and may respectively extend generally along the second direction D2.

Data voltages may be applied to the data line 130 from a data driving part. The data line 130 may include, for example, aluminum (Al), gold (Au), silver (Ag), copper (Cu), iron (Fe), nickel (Ni), etc. These may be used alone or in a mixture thereof. A portion of the data line 130 contacting the semiconductor pattern 120 through the first contact opening CNT1 may act as a source electrode of the thin film transistor TFT.

The third insulation layer 135 may be disposed on the first base substrate 100 on which the data line 130 is disposed. The third insulation layer 135 may include, for example, the same material as the first insulation layer 125.

The drain electrode pattern 140 may be disposed on the third insulation layer 135. The drain electrode pattern 140 may be electrically coupled to (e.g., electrically connected to) the semiconductor pattern 120 through a second contact opening CNT2 (e.g., a second contact hole) defined in each of the first insulation layer 125, the second insulation layer 127, and the third insulation layer 135. The drain electrode pattern 140 may partially extend parallel with the data line 130. For example, the drain electrode pattern 140 may extend along the sixth direction D6 in the first sub-pixel row PX1 and may extend along the fourth direction D4 in the second sub-pixel row PX2. The drain electrode pattern 140 may be electrically coupled to (e.g., electrically connected to) the data line 130 which is located on a left side of (e.g., a lower corner left side of) the drain electrode pattern 140 along the first direction D1 in the first sub-pixel row PX1. The drain electrode pattern 140 may be electrically coupled to (e.g., electrically connected to) the data line 130 which is located on a right side of (e.g., a lower corner right side of) the drain electrode pattern 140 along the first direction D1 in the second sub-pixel row PX2. The drain electrode pattern 140 may include, for example, the same material as the data line 130. For example, the drain electrode pattern 140 may include aluminum (Al), gold (Au), silver (Ag), copper (Cu), iron (Fe), nickel (Ni), etc.

As mentioned above, in the present example embodiment of the invention, the drain electrode pattern 140 may be disposed at a different layer than the data line 130. Accordingly, a gap (e.g., a horizontal gap) between the data line 130 and the drain electrode pattern 140 may be reduced, thereby reducing an electrical influence by the data line 130 on the drain electrode pattern 140. Also, an entire size of the unit pixel group along the first direction D1 may be reduced to implement an ultra-high definition display in a liquid crystal display panel.

The passivation layer 145 may be disposed on the first base substrate 100 on which the drain electrode pattern 140 is disposed. The passivation layer 145 may include, for example, the same material as the first insulation layer 125.

The pixel electrodes 150 and 160 may be disposed on the passivation layer 145. The pixel electrodes 150 and 160 may be electrically coupled to (e.g., electrically connected to) the drain electrode pattern 140 through a third contact opening CNT3 (e.g., third contact hole) defined in the passivation layer 145. The pixel electrodes 150 and 160 may include, for example, a transparent conductive material. For example, the pixel electrodes 150 and 160 may include indium zinc oxide (IZO), indium tin oxide (ITO), tin oxide ($SnO_x$), zinc oxide ($ZnO_x$), etc. The pixel electrodes 150 and 160 may include a first pixel electrode 150 disposed in the first sub-pixel row PX1 and a second pixel electrode 160 disposed in the second sub-pixel row PX2. The first pixel electrode 150 may be electrically coupled to (e.g., electrically connected to) the data line 130 which is located on a left side of (e.g., a lower corner left side of) the first pixel electrode 150 along the first direction D1. The second pixel electrode 160 may be electrically coupled to (e.g., electrically connected to) the data line 130 which is located on a right side of (e.g., a lower corner right side of) the second pixel electrode 160 along the first direction D1.

The first pixel electrode 150 may include a plurality of first slit portions SL1 spaced from (e.g., spaced apart from) each other by an interval (e.g., a desired or predetermined interval). For example, the first slit portions SL1 may partially extend along the sixth direction D6. The first pixel electrode 150 may include an upper end portion 150a and a lower end portion 150b. For example, the upper end portion 150a of the first pixel electrode 150 may be substantially parallel with the lower end portion 150b of the first pixel electrode 150. The lower end portion 150b of the first pixel electrode 150 may be, for example, substantially parallel with the first inclined portion 110a_1 of the first gate line 110_1.

The second pixel electrode 160 may include a plurality of second slit portions SL2 spaced from (e.g., spaced apart from) each other by an interval (e.g., by a desired or predetermined interval). For example, the second slit portions SL2 may partially extend along the fourth direction D4. The second pixel electrode 160 may include an upper end portion 160a and a lower end portion 160b. For example, the upper end portion 160a of the second pixel electrode 160 may be substantially parallel with the first inclined portion 110a_1 of the first gate line 110_1. The lower end portion 160b of the second pixel electrode 150 may be substantially parallel with the second inclined portion 110a_2 of the second gate line 110_2. For example, the upper end portion 160a of the second pixel electrode 160 may not be parallel with the lower end portion 160b of the second pixel electrode 160. An area (e.g., a surface area) of the second pixel electrode 160 may be larger than an area (e.g., a surface area) of the first pixel electrode 150.

As mentioned above, in the present example embodiment of the invention, the pixel electrodes 150 and 160 may include the slit portions SL1 and SL2 extending along different directions in the first sub-pixel row PX1 and the second sub-pixel row PX2, thereby providing a wider viewing angle.

The organic insulation layer 155 may be disposed on the first base substrate 100 on which the pixel electrodes 150 and 160 are disposed. The organic insulation layer 155 may have a substantially flat or planar surface. The organic insulation layer 155 may include, for example, a transparent insulation material. For example, the organic insulation layer 155 may include an acryl resin, a phenol resin, etc.

The common electrode 190 may be disposed on the organic insulation layer 155. The common electrode 190 may be disposed on an substantially all (e.g., an entirety) of the unit pixel group. For example, the common electrode 190 may be entirely disposed on the first sup-pixel part, the second sub-pixel part, the third sub-pixel part, and the fourth sub-pixel part. The common electrode 190 may include, for example, a transparent conductive material. For example, the common electrode 190 may include indium zinc oxide (IZO), indium tin oxide (ITO), tin oxide ($SnO_x$), zinc oxide ($ZnO_x$), etc.

The protection layer 195 may be disposed on the common electrode 190. The protection layer 190 may include, for example, a transparent insulation material.

As mentioned above, when a liquid crystal display panel includes the array substrate according to the present example embodiment, a plane-to-line switching (PLS) mode may be implemented which is different from a twisted nematic (TN) mode. In the TN mode, backlight luminance may be adjusted by vertically arranging liquid crystals due to a vertical electric field between an array substrate and an opposing substrate. However, in the PLS mode, the backlight luminance may be adjusted by horizontally arranging liquid crystals due to a horizontal electric field generated by the pixel electrodes 150 and 160 and the common electrode 190.

Also, in the array substrate according to the present example embodiment, the unit pixel group arranged in a matrix shape may include the data line 130 and the gate line 110 extending in a zigzag shape with respect to an arrangement direction of the unit pixel group (e.g., the first direction D1 and the second direction D2), and the data line 130 may be disposed in a different layer from the drain electrode pattern 140, thereby reducing the gap (e.g., the horizontal gap) between the data line 130 and the drain electrode pattern 140 to improve display resolution of a liquid crystal display panel.

FIGS. 3A to 3H are cross-sectional views illustrating a manufacturing method of the array substrate of FIG. 2.

Figure 3A:
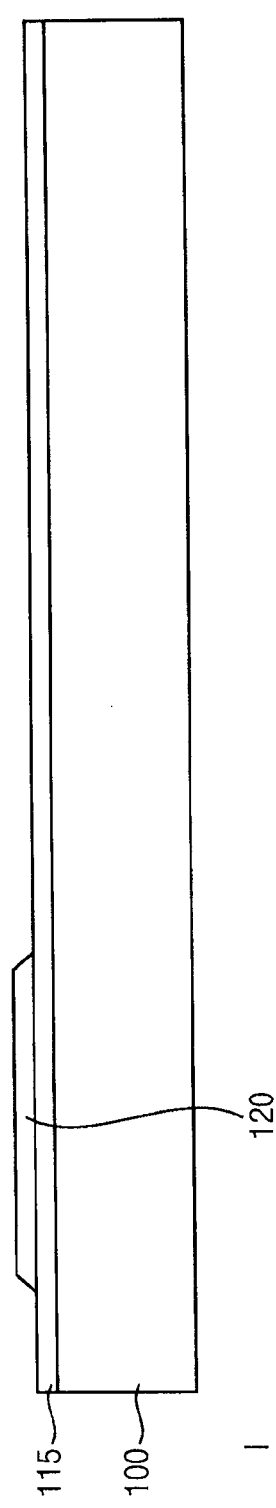
FIGS. 3A to 3H are cross-sectional views illustrating a manufacturing method of the array substrate shown in FIG. 2.

Referring to FIG. 3A, a buffer layer 115 may be formed on a first base substrate 100. A semiconductor pattern 120 may be formed on the buffer layer 115. The semiconductor pattern 120 may include, for example, a poly-crystalline silicon material. The poly-crystalline silicon material may be formed by a dehydrogenation process of an amorphous silicon material and a subsequent crystallization process. For example, the poly-crystalline silicon material may be formed by a low temperature poly-silicon ("LTPS") process which is conducted at a temperature greater than about 300 degrees Celsius.

Figure 3B:
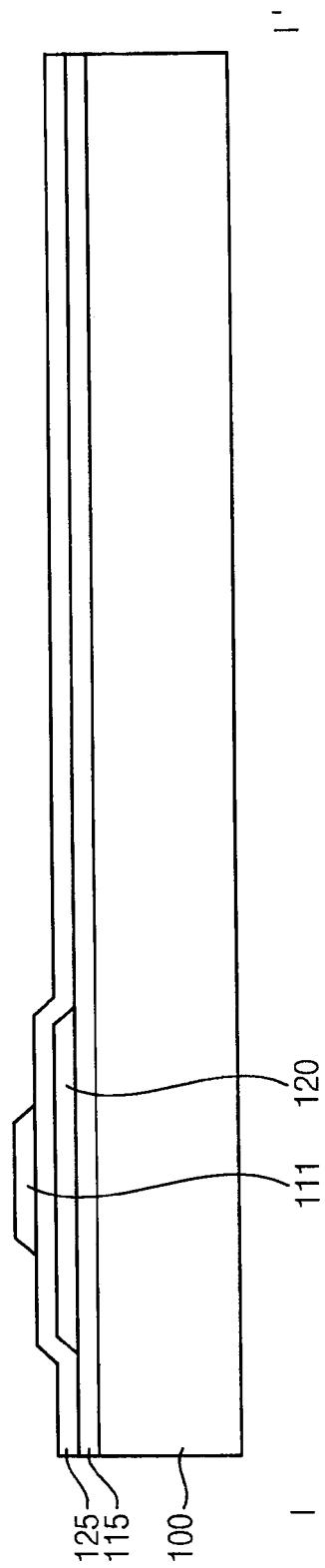

Referring to FIG. 3B, a first insulation layer 125 may be formed on the first base substrate 100 on which the semiconductor pattern 120 is formed. A gate line 110 and a gate electrode 111 may be formed on the first insulation layer 125. The gate line 110 may include, for example, aluminum (Al), gold (Au), silver (Ag), copper (Cu), iron (Fe), nickel (Ni), etc. These may be used alone or in a mixture thereof. The gate line 110 may include, for example, indium doped zinc oxide (IZO), gallium doped zinc oxide (GZO), etc. The gate electrode 111 may include, for example, the same material as the gate line 110. For example, the gate electrode 111 may be integrally formed with the gate line 110. The gate electrode 111 may overlap the semiconductor pattern 120. For example, the gate electrode 111 may overlap a central portion of the semiconductor pattern 120.

Figure 3C:
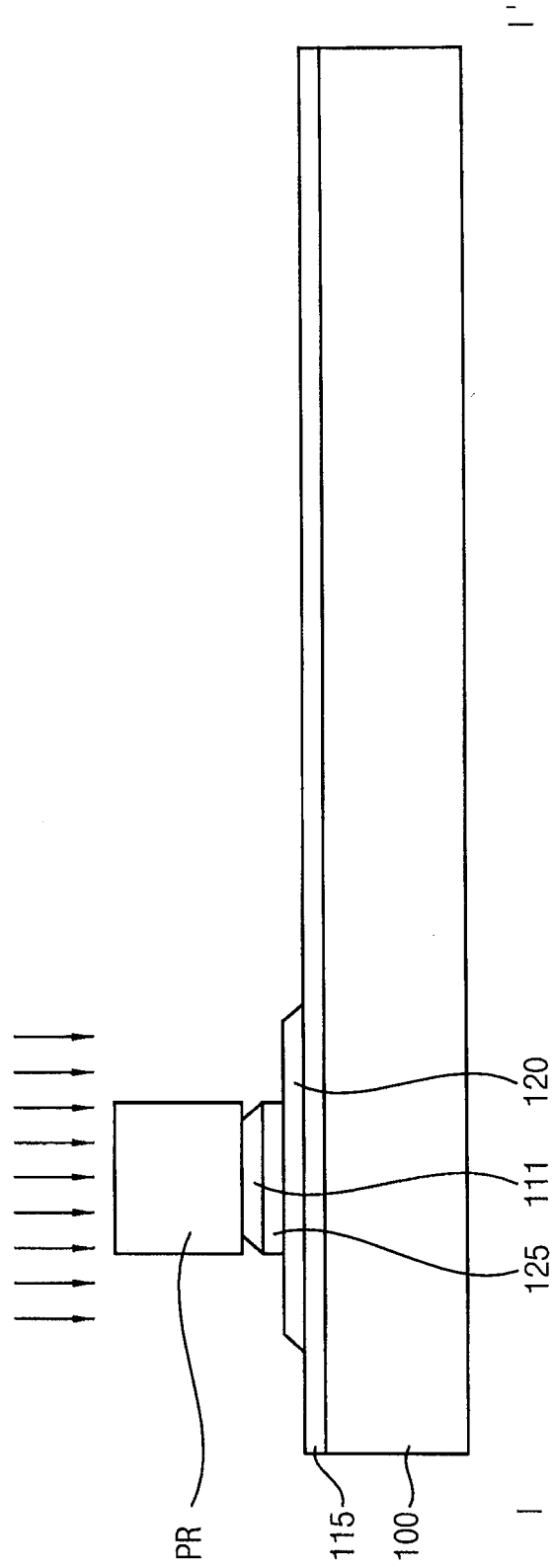

Referring to FIG. 3C, a photoresist pattern PR may be formed on the first base substrate 100 on which the gate electrode 111 is formed. The photoresist pattern PR may overlap the gate electrode 111. The photoresist pattern PR may be used as an etch mask (e.g., an etch stopper) to partially remove the first insulation layer 125. For example, end portions of the semiconductor pattern 120 may be exposed by the partial removal of the first insulation layer 125. Positive n ions (i.e., n+ ions) may be doped on the semiconductor pattern 120 on which the photoresist pattern PR is disposed.

Figure 3D:
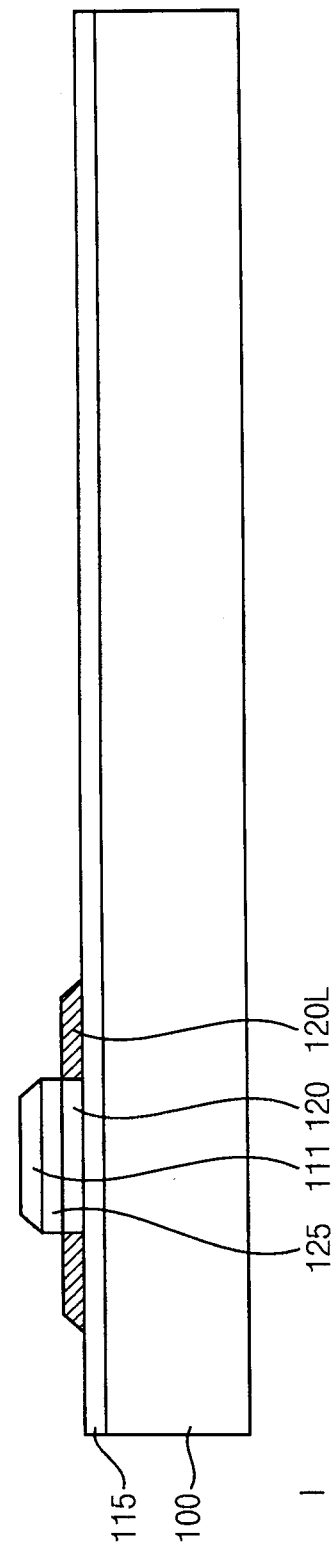
Figure 3E:
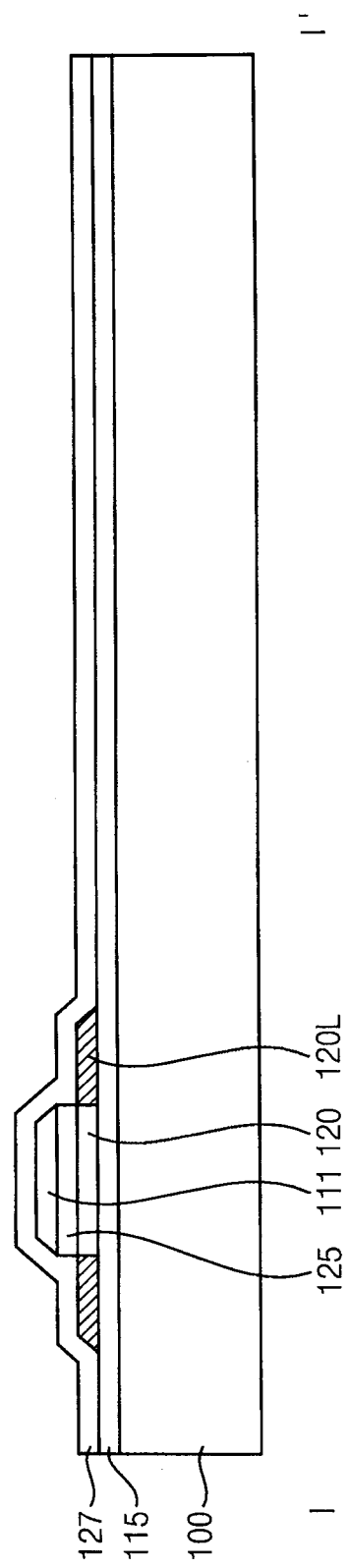

Referring to FIG. 3D and FIG. 3E, lightly doped drain regions 120L may be formed at the end portions of the semiconductor pattern 120 due to the ion doping. A second insulation layer 127 may be formed on the first base substrate 100 on which the lightly doped drain regions 120L are formed.

Figure 3F:
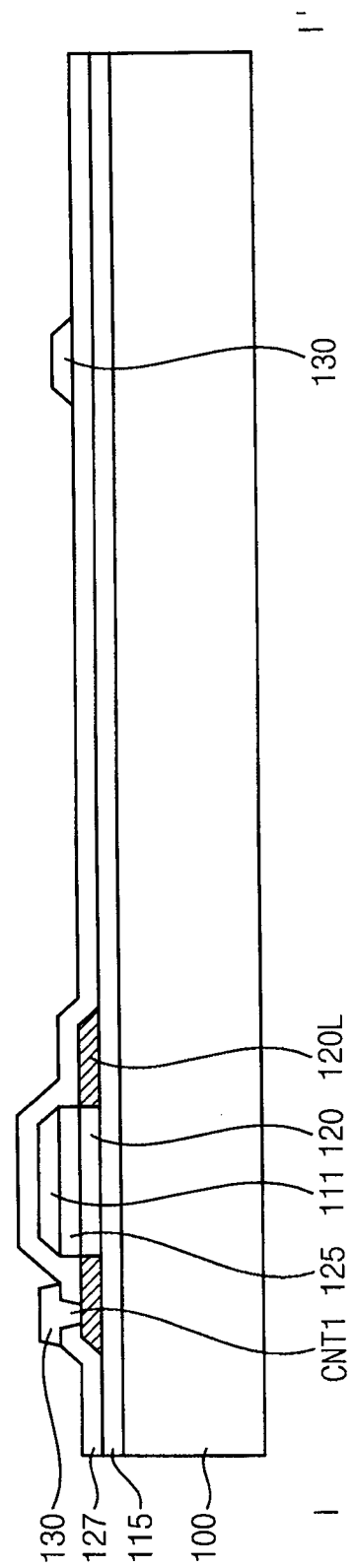

Referring to FIG. 3F, a first contact opening CNT1 (e.g., a first contact hole) may be formed in the second insulation layer 127 to expose a portion of one of the lightly doped drain regions 120L. A data line 130 may be formed at the first contact opening CNT1 to contact the semiconductor pattern 120. The data line 130 may be bent or curved at or between unit pixel groups when viewed in a plan view.

Figure 3G:
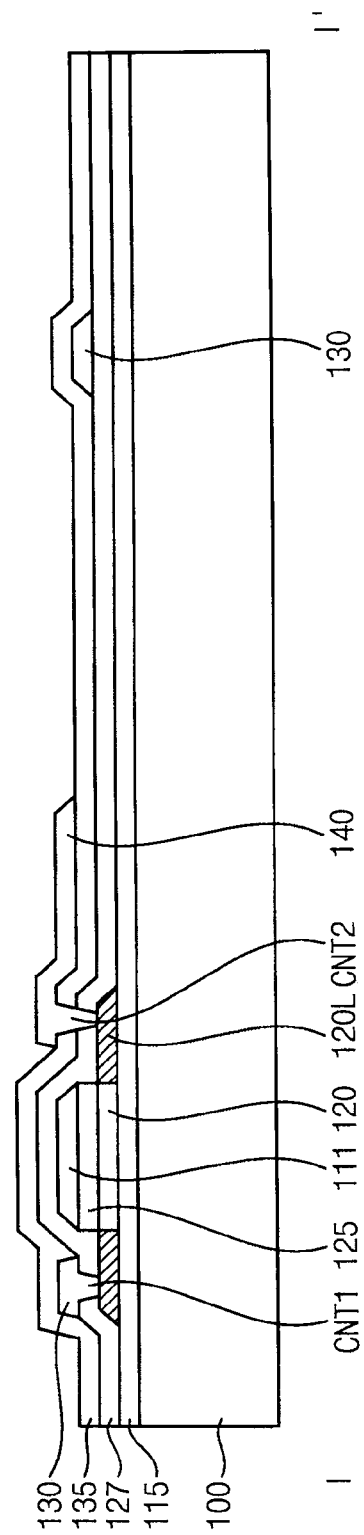

Referring to FIG. 3G, a third insulation layer 135 may be formed on the first base substrate 100 on which the data line 130 is formed. A drain electrode pattern 140 may be formed on the third insulation layer 135. A second contact opening CNT2 (e.g., a second contact hole) may be formed in the second insulation layer 127 and the third insulation layer 135 to expose a portion of an other of the lightly doped drain regions 120L. The drain electrode pattern 140 may contact the semiconductor pattern 120 through the second contact opening CNT2. The drain electrode pattern 140 may be substantially parallel with the data line 130 when viewed in a plan view.

Figure 3H:
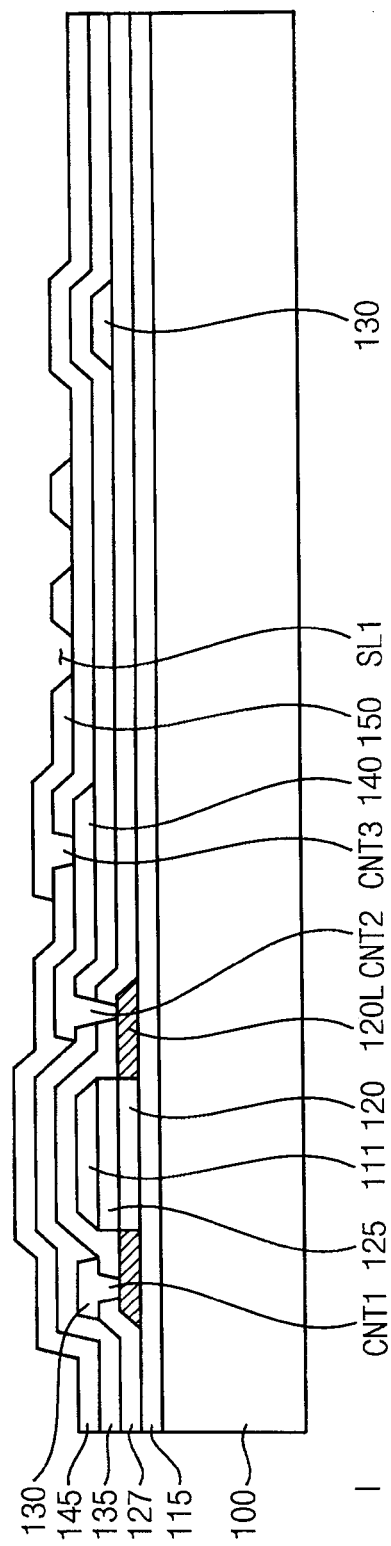

Referring to FIG. 3H, a passivation layer 145 may be formed on the first base substrate 100 on which the drain electrode pattern 140 is formed. A third contact opening CNT3 (e.g., a third contact hole) may be formed in the passivation layer 145 to partially expose the drain electrode pattern 140. A pixel electrode 150 may be formed at the third contact opening CNT3 to contact the drain electrode pattern 140. The pixel electrode 150 may include a plurality of slit portions SL1. The pixel electrode 150 may include, for example, a transparent conductive material.

Referring to FIG. 2 and FIG. 3H, an organic insulation layer 155 may be formed on the first base substrate 100 on which the pixel electrode 150 is formed. The organic insulation layer 155 may have a substantially flat or planar surface. A common electrode 190 may be formed on the organic insulation layer 155. The common electrode 190 may include, for example, a transparent conductive material. A protection layer 195 may be formed on the common electrode 190. The protection layer 195 may cover the common electrode 190. The protection layer 195 may include, for example, a transparent insulation material.

Figure 4:
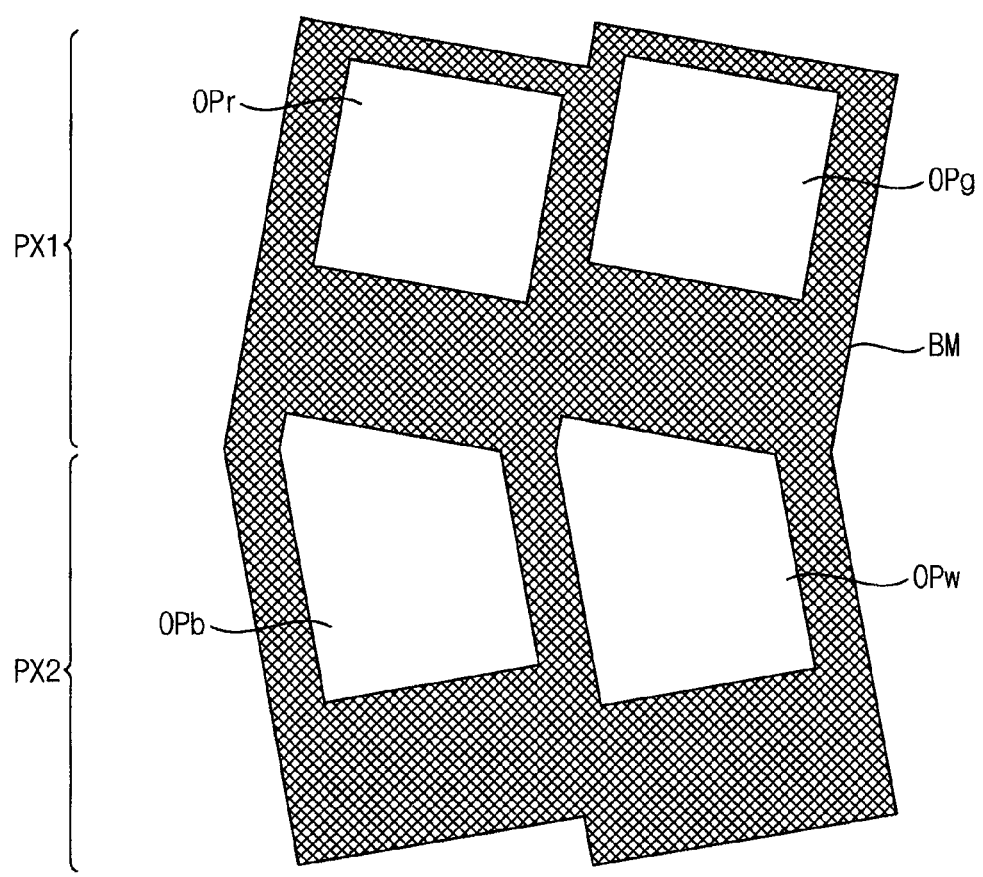
FIG. 4 is a plan view illustrating a light blocking pattern disposed on the array substrate shown in FIG. 1.

FIG. 4 is a plan view illustrating a light blocking pattern disposed on the array substrate shown in FIG. 1.

Referring to FIG. 4, a width of a light blocking pattern BM along the sixth direction D6 may be greater (e.g., longer) than a width of the light blocking pattern BM along the fifth direction D5 that crosses (e.g., that is substantially perpendicular to) the sixth direction D6 in each of the first sub-pixel part and the second sub-pixel part. Also, a width of the light blocking pattern BM along the fourth direction D4 may be greater (e.g., longer) than a width of the light blocking pattern BM along the third direction D3 that crosses (e.g., that is substantially perpendicular to) the fourth direction D4 in the third sub-pixel part and the fourth sub-pixel part. For example, the light blocking pattern BM may be bent or curved at or between the first sub-pixel part and the third sub-pixel part of the unit pixel group. The light blocking pattern BM may be bent or curved at or between the second sub-pixel part and the fourth sub-pixel part of the unit pixel group.

The light blocking pattern BM may have a first opening region OPr (e.g., a first opening area) and a second opening region OPg (e.g., a second opening area), each having a first area (e.g., a first surface area) in the first sub-pixel part and the second sub-pixel part, respectively. The light blocking pattern BM may have a third opening region OPb (e.g., a third opening area) and a fourth opening region OPw (e.g., a fourth opening area), each having a second area (e.g., a second surface area) in the third sub-pixel part and the fourth sub-pixel part, respectively. The second area of the third opening region OPb or the fourth opening region OPw may be larger than the first area of the first opening region OPr or the second opening region OPg.

Figure 5:
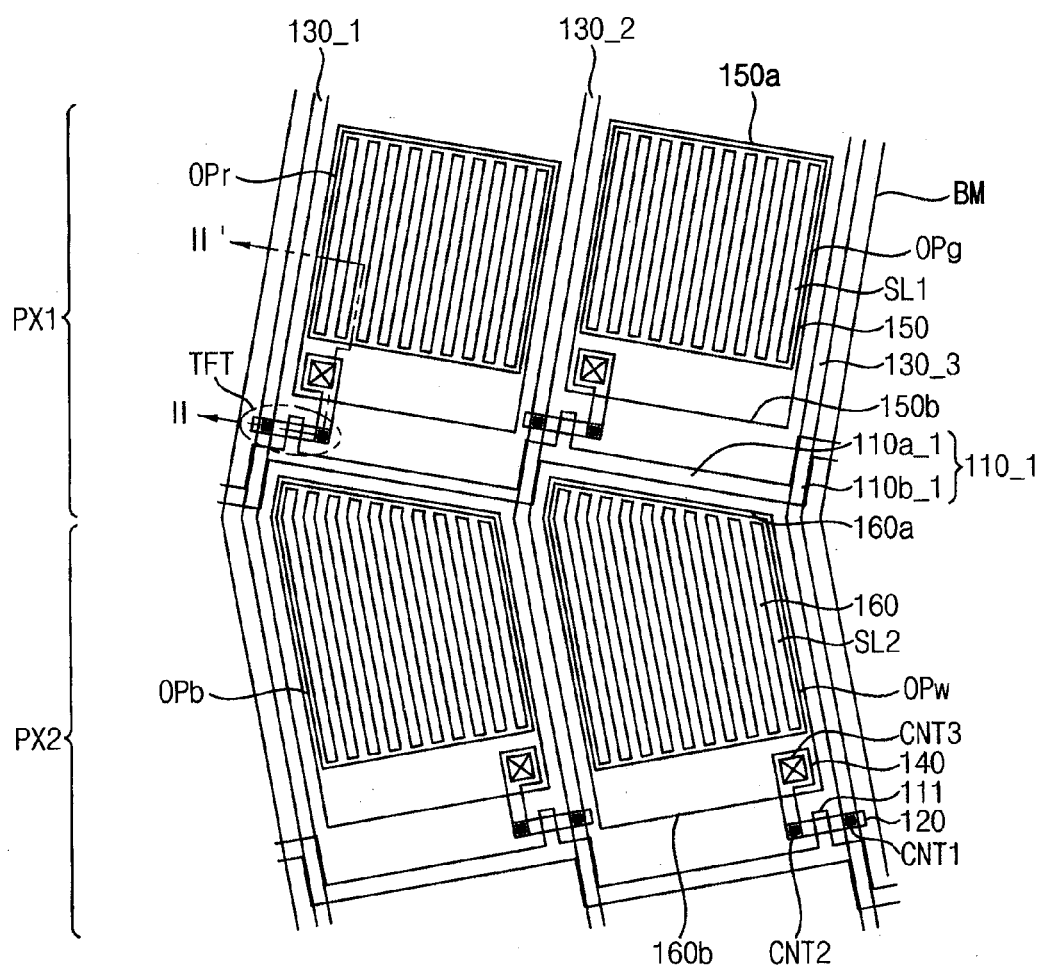
FIG. 5 is a plan view illustrating a liquid crystal display panel having the array substrate shown in FIG. 1 and the light blocking pattern shown in FIG. 4.
Figure 6:
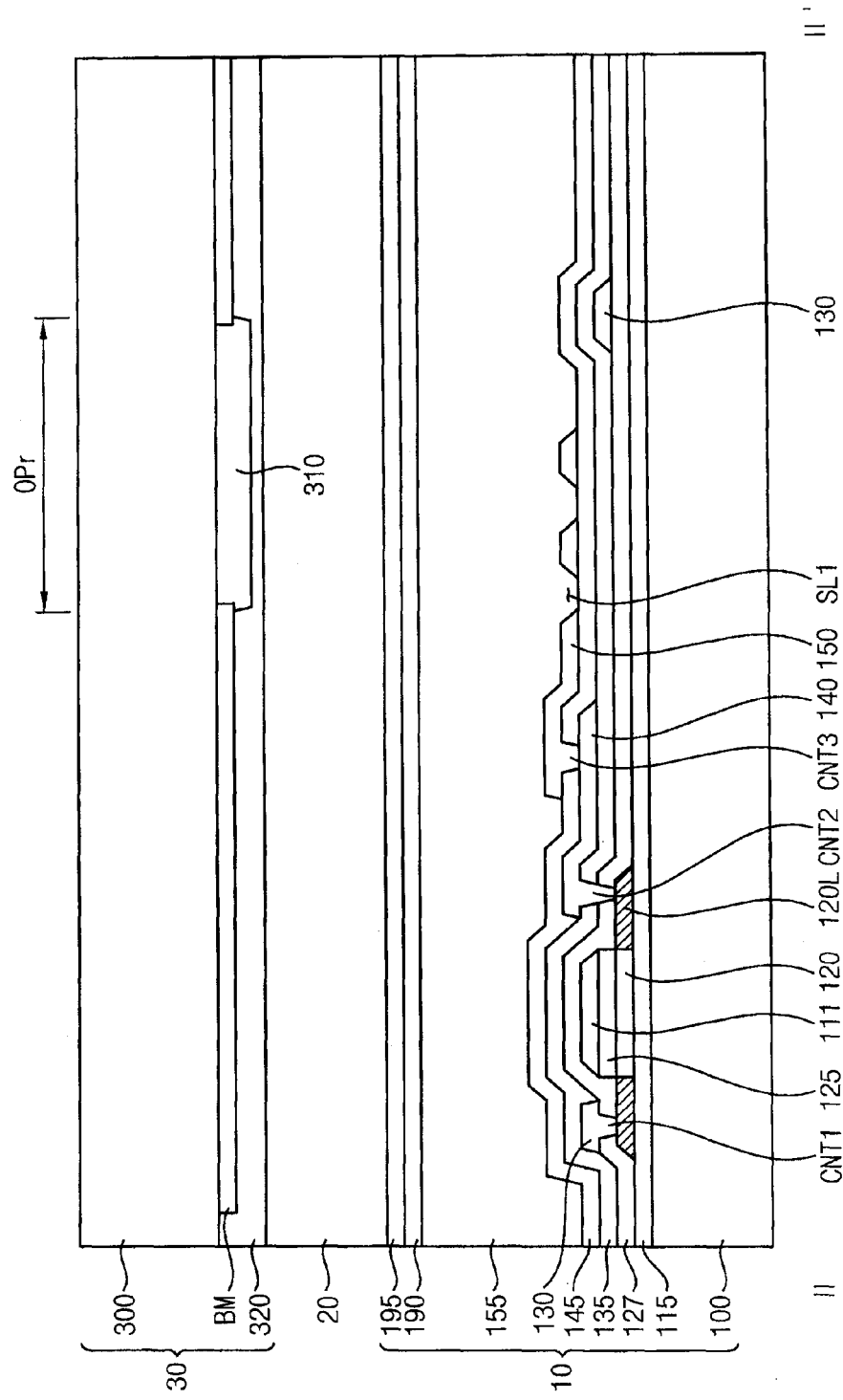
FIG. 6 is a cross-sectional view taken along the line of FIG. 5.

FIG. 5 is a plan view illustrating a liquid crystal display panel having the array substrate shown in FIG. 1 and the light blocking pattern shown in FIG. 4. FIG. 6 is a cross-sectional view taken along the line II-II' of FIG. 5.

Referring to FIG. 1, FIG. 2, FIG. 4, FIG. 5, and FIG. 6, a liquid crystal display panel according to the present example embodiment of the invention may include an array substrate 10, a liquid crystal layer 20, and an opposing substrate 30. The array substrate 10 may be substantially the same as the array substrate illustrated in FIG. 2. Thus, detailed description of the identical elements may be omitted.

The opposing substrate 30 may include a second base substrate 300, the light blocking pattern BM, a color filter pattern 310, and an overcoating layer 320.

The second base substrate 300 may include a transparent insulation material. For example, the second base substrate 300 may include, glass, quartz, plastic, polyethylene terephthalate (PET) resin, polyethylene (PE) resin, polycarbonate (PC) resin, etc.

The light blocking pattern BM may include the first opening region OPr and the second opening region OPg in the first sub-pixel row PX1. The light blocking pattern BM may include the third opening region OPb and the fourth opening region OPw in the second sub-pixel row PX2. The first to fourth opening regions OPr, OPg, OPb, and OPw may overlap slit portions SL1 and SL2 formed in the pixel electrodes 150 and 160 in the array substrate 10.

The color filter pattern 310 may be disposed on the second base substrate 300 to correspond with at least one of the first to fourth opening regions OPr, OPg, OPb, and OPw. The color filter pattern 310 may include red, green, and/or blue color filter patterns. For example, the color filter pattern 310 may include a red color filter pattern corresponding to the first opening region OPr, a green color filter pattern corresponding to the second opening region OPg and a blue color filter pattern corresponding to the third opening region OPb. The fourth opening region OPw may not overlap the color filter pattern 310. Alternatively, an open pattern (e.g., a white filter pattern) may correspond to the fourth opening region OPw.

For example, in the present example embodiment, the color filter pattern 310 may have a PenTile structure having a square matrix format of four colors, i.e., red R, green G, blue B, and white W. In this case, an opening region corresponding to the blue B portion of the PenTile structure may have a larger area (e.g., a larger surface area) than an opening region corresponding to another color portion of the PenTile structure. For example, an opening area of the third opening region OPb may be larger than an opening area of the first opening region OPr or the second opening region OPg. An opening area corresponding to the white W portion of the PenTile structure may be substantially the same as the opening area corresponding to the blue B portion of the PenTile structure. For example, an opening area of the fourth opening region OPw may be substantially the same as the opening area of the third opening region OPb. Accordingly, an opening area corresponding to a blue color filter pattern may be larger than an opening area corresponding to a red color filter pattern or a green color filter pattern, thereby improving white balance of the liquid crystal display panel to adequately fit the human visual system.

The overcoating layer 320 may have a substantially flat or planar surface.

As mentioned above, the liquid crystal display panel according to the present example embodiment of the invention may include sub-pixel parts having different opening areas in the first sub-pixel row PX1 and the second sub-pixel row PX2 in the unit pixel group, thereby reducing a luminance decrease occurring at an interface of the first sub-pixel row PX1 and the second sub-pixel row PX2 and providing a wider viewing angle.

Furthermore, an opening area corresponding to a color (e.g., blue) may be larger than an opening area corresponding to another color (e.g., red, green, etc.) in the unit pixel group, thereby improving luminance and white balance of the liquid crystal display panel.

Figure 7:
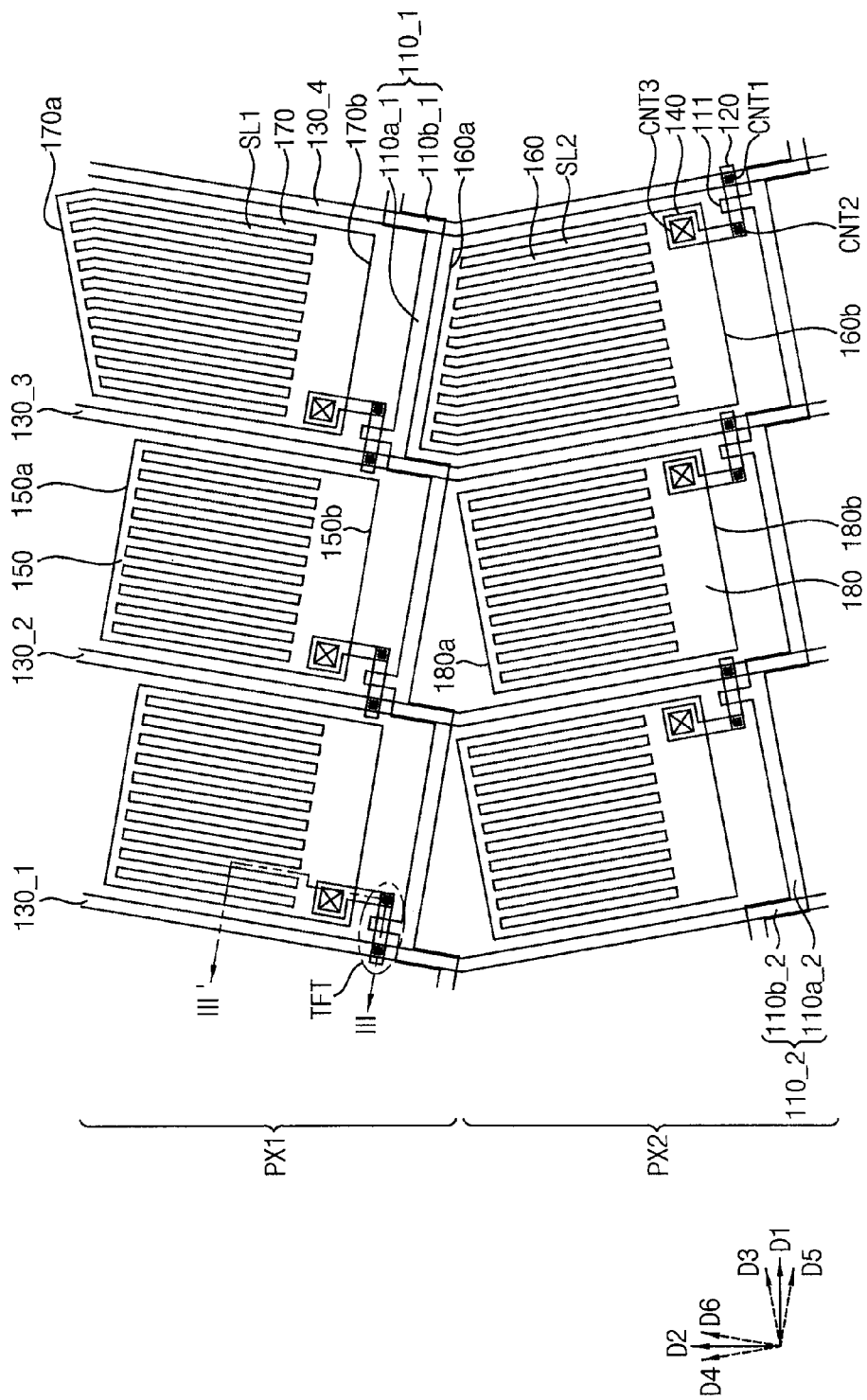
FIG. 7 is a plan view illustrating an array substrate according to another example embodiment of the invention.
Figure 8:
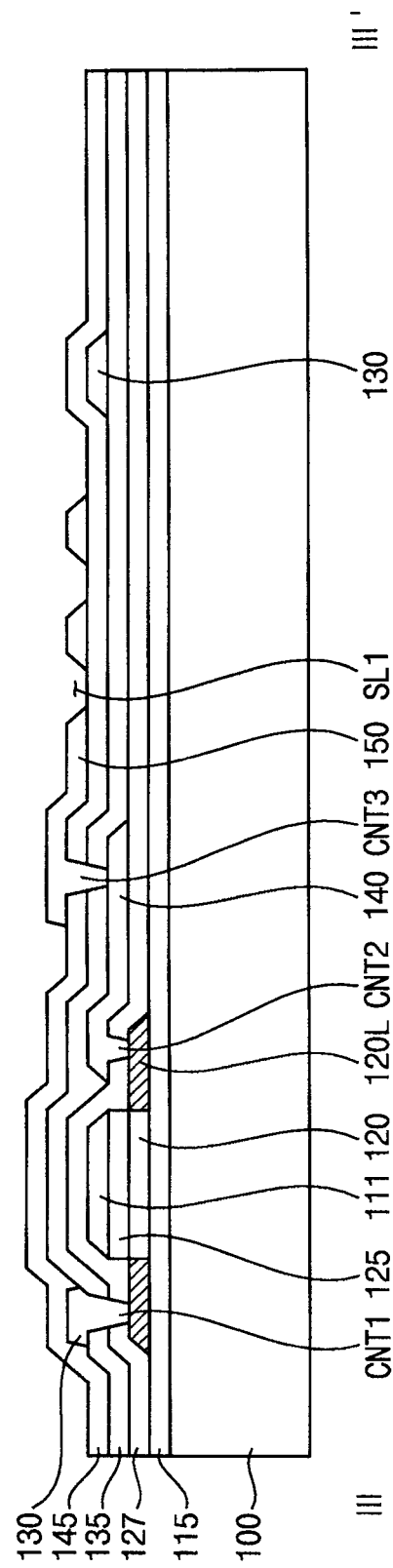
FIG. 8 is a cross-sectional view taken along the line III-III' of FIG. 7.

FIG. 7 is a plan view illustrating an array substrate according to another example embodiment of the invention. FIG. 8 is a cross-sectional view taken along the line of FIG. 7.

Referring to FIG. 7 and FIG. 8, an array substrate according to the present example embodiment includes a unit pixel group arranged in a matrix shape along a first direction D1 and a second direction D2 crossing (e.g., substantially perpendicular to) the first direction D1. The unit pixel group includes a plurality of sub-pixel parts disposed in a first sub-pixel row PX1 and in a second sub-pixel row PX2 adjacent to the first sub-pixel row PX1. For example, the unit pixel group may include three sub-pixel parts in each of the first sub-pixel row PX1 and in the second sub-pixel row PX2. Although the unit pixel group shown in FIG. 7 includes three sub-pixel parts in each of the first sub-pixel row PX1 and the second sub-pixel row PX2, the number of sub-pixel parts of the unit pixel group is not limited thereto. Hereinafter, the three sub-pixel parts sequentially disposed (e.g., arranged) in the first sub-pixel row PX1 along the first direction D1 are referred as a first sub-pixel part, a second sub-pixel part, and a third sub-pixel part. Also, the three sub-pixel parts sequentially disposed (e.g., arranged) in the second sub-pixel row PX2 along the first direction D1 are referred as a fourth sub-pixel part, a fifth sub-pixel part, and a sixth sub-pixel part.

The array substrate illustrated in FIG. 7 and FIG. 8 is substantially the same as the array substrate illustrated in FIG. 1 and FIG. 2 except that the unit pixel group includes three sub-pixel parts in each first and second sub-pixel row PX1 and PX2 and that sizes of pixel electrodes disposed in rightmost sub-pixel parts are greater than sizes of other pixel electrodes and that a data line 130 is disposed on a first base substrate 100 on which a drain electrode pattern 140 is disposed. Hereinafter, detailed description of the identical elements may be omitted.

The array substrate may include a first base substrate 100, a buffer layer 115, a gate line 110, a data line 130, a first insulation layer 125, a second insulation layer 127, a third insulation layer 135, a thin film transistor TFT, a passivation layer 145, and pixel electrodes 150 and 160. The thin film transistor TFT may include a semiconductor pattern 120, a gate electrode 111, and a drain electrode pattern 140.

The first base substrate 100 may include a transparent insulation material.

The buffer layer 115 may be disposed on the first base substrate 100.

The semiconductor pattern 120 may be disposed on the buffer layer 115. The semiconductor pattern 120 may be formed by a low temperature poly-silicon ("LTPS") process which is conducted at a temperature greater than about 300 degrees Celsius.

The first insulation layer 125 may be disposed on the first base substrate 100 on which the semiconductor pattern 120 is disposed. The first insulation layer 125 may be disposed at a channel region between lightly doped drain regions 120L of the semiconductor pattern 120.

The gate line 110 may include a first gate line 110_1 electrically coupled to (e.g., electrically connected to) first pixel electrodes 150 and a third pixel electrode 170 disposed in the first sub-pixel row PX1. The gate line 110 may also include a second gate line 110_2 electrically coupled to (e.g., electrically connected to) a second pixel electrode 160 and fourth pixel electrodes 180 disposed in the second sub-pixel row PX2. The first gate line 110_1 may include a first inclined portion 110a_1 partially extending along a fifth direction D5 tilted in a clockwise direction with respect to the first direction D1 and a first connecting portion 110b_1 partially extending along a sixth direction D6 crossing (e.g., substantially perpendicular to) the fifth direction D5. The first inclined portion 110a_1 and the first connecting portion 110b_1 may together have a first zigzag shape. The first connecting portion 110b_1 may overlap the data line 130. The second gate line 110_2 may include a second inclined portion 110a_2 partially extending along a third direction D3 tilted in a counterclockwise direction with respect to the first direction D1 and a second connecting portion 110b_2 partially extending along a fourth direction D4 crossing (e.g., substantially perpendicular to) the third direction D3. The second inclined portion 110a_2 and the second connecting portion 110b_2 may together have a second zigzag shape. The second connecting portion 110b_2 may overlap the data line 130. In the present embodiment, the first zigzag shape and the second zigzag shape may be generally symmetrical and/or may generally repeat with respect to an axis along the first direction D1. For example, the first gate line 110_1 and the second gate line 110_2 may have zigzag shapes generally symmetrical to each other and may respectively extend generally along the first direction D1.

The gate electrode 111 may be electrically coupled to (e.g., electrically connected to) the gate line 110. For example, the gate electrode 111 may be integrally formed with the gate line 110. For example, the gate electrode 111 may protrude along the sixth direction D6 from the first inclined portion 110a_1 in the first sub-pixel row PX1. For example, the gate electrode 111 may protrude along the fourth direction D4 from the second inclined portion 110a_2 in the second sub-pixel row PX2.

The second insulation layer 127 may be disposed on the first base substrate 100 on which the gate electrode 111 is disposed.

The drain electrode pattern 140 may be disposed on the second insulation layer 127. The drain electrode pattern 140 may be electrically coupled to (e.g., electrically connected to) the semiconductor pattern 120 through a second contact opening CNT2 (e.g., a second contact hole) defined in the second insulation layer 127. For example, the drain electrode pattern 140 may contact (e.g., directly contact) a portion of one of the lightly doped drain regions 120L exposed by the second contact opening CNT2. The drain electrode pattern 140 may partially extend parallel with the data line 130. For example, the drain electrode pattern 140 may extend along the sixth direction D6 in the first sub-pixel row PX1 and may extend along the fourth direction D4 in the second sub-pixel row PX2.

The third insulation layer 135 may be disposed on the first base substrate 100 on which the drain electrode pattern 140 is disposed.

The data line 130 may be disposed on the third insulation layer 135. The data line 130 may be electrically coupled to (e.g., electrically connected to) the semiconductor pattern 120 through a first contact opening CNT1 (e.g., a first contact hole) defined in the second insulation layer 127 and the third insulation layer 135. For example, the data line 130 may contact (e.g., directly contact) a portion of an other of the lightly doped drain regions 120L exposed by the first contact opening CNT1. The data line 130 may include a first data line 130_1, a second data line 130_2, a third data line 130_3, and a fourth data line 130_4 arranged (e.g., sequentially disposed) along the first direction D1. The first data line 130_1, the second data line 130_2, the third data line 130_3, and the fourth data line 130_4 may be bent or curved in the unit pixel group, respectively (e.g., may be bent or curved at or between the first and second sub-pixel rows PX1 and PX2). For example, the first data line 130_1, the second data line 130_2, the third data line 130_3, and the fourth data line 130_4 may extend along the sixth direction D6 in the first sub-pixel row PX1 and may extend along the fourth direction D4 in the second sub-pixel row PX2, respectively. For example, the first data line 130_1, the second data line 130_2, the third data line 130_3, and the fourth data line may be parallel with each other (e.g., may be similarly bent or curved) and may each generally extend along the second direction D2.

As mentioned above, in the present example embodiment of the invention, the drain electrode pattern 140 may be disposed in a different layer than the data line 130. Accordingly, the gap (e.g., the horizontal gap) between the data line 130 and the drain electrode pattern 140 may be reduced, thereby reducing an electrical influence by the data line 130 on the drain electrode pattern 140. Also, an entire size of the unit pixel group along the first direction D1 may be reduced to implement an ultra-high definition display in a liquid crystal display panel.

The passivation layer 145 may be disposed on the first base substrate 100 on which the data line 130 is disposed.

The pixel electrodes 150, 160, 170, and 180 may be disposed on the passivation layer 145. The pixel electrodes 150, 160, 170, and 180 may be electrically coupled to (e.g., electrically connected to) the drain electrode pattern 140 through a third contact opening CNT3 (e.g., a third contact hole) defined in the passivation layer 145 and the third insulation layer 135. The pixel electrodes 150, 160, 170, and 180 may include first pixel electrodes 150 and a third pixel electrode 170 disposed in the first sub-pixel row PX1 and a second pixel electrode 160 and fourth pixel electrodes 180 disposed in the second sub-pixel row PX2. The first pixel electrodes 150 and the third pixel electrode 170 may be electrically coupled to (e.g., electrically connected to) the data line 130 which is located at a left side of (e.g., a lower corner left side of) each of the first pixel electrodes 150 and the third pixel electrode 170 along the first direction D1. The second pixel electrode 160 and the fourth pixel electrodes 180 may be electrically coupled to (e.g., electrically connected to) the data line 130 which is located at a right side of (e.g., a lower corner right side of) each of the second pixel electrode 160 and the fourth pixel electrodes 180 along the first direction D1.

The first pixel electrodes 150 may be disposed in the first sub-pixel part and the second sub-pixel part. The first pixel electrodes 150 may include a plurality of first slit portions SL1 spaced from (e.g., spaced apart from) each other by an interval (e.g., a desired or predetermined interval). For example, the first slit portions SL1 may partially extend along the sixth direction D6. The first pixel electrodes 150 may include an upper end portion 150a and a lower end portion 150b, respectively. For example, the upper end portion 150a of each of the first pixel electrodes 150 may be substantially parallel with the lower end portion 150b of each of the first pixel electrodes 150. The lower end portion 150b of each of the first pixel electrodes 150 may be, for example, substantially parallel with the first inclined portion 110a_1 of the first gate line 110_1.

The third pixel electrode 170 may be disposed in the third sub-pixel part. The third pixel electrode 170 may include the first slit portions SL1 spaced from (e.g., spaced apart from) each other by an interval (e.g., a desired or predetermined interval). For example, the first slit portions SL1 may partially extend along the sixth direction D6. The third pixel electrode 170 may include an upper end portion 170a and a lower end portion 170b. For example, the upper end portion 170a of the third pixel electrode 170 may be substantially parallel with the second inclined portion 110a_2 of the second gate line 110_2. The lower end portion 170b of the third pixel electrode 170 may be substantially parallel with the first inclined portion 110a_1 of the first gate line 110_1. For example, the upper end portion 170a of the third pixel electrode 170 may not be parallel with the lower end portion 170b of the third pixel electrode 170. An area (e.g., a surface area) of the third pixel electrode 170 may be greater (e.g., larger) than an area (e.g., a surface area) of each of the first pixel electrodes 150. In another example embodiment, the first pixel electrode 150 may be disposed in the third sub-pixel part instead of the third pixel electrode 170.

The fourth pixel electrodes 180 may be disposed in the fourth sub-pixel part and the fifth sub-pixel part. The fourth pixel electrodes 180 may include a plurality of second slit portions SL2 spaced from (e.g., spaced apart from) each other by an interval (e.g., a desired or predetermined interval). For example, the second slit portions SL2 may partially extend along the fourth direction D4. The fourth pixel electrodes 180 may include an upper end portion 180a and a lower end portion 180b. For example, the upper end portion 180a of the fourth pixel electrode 180 may be substantially parallel with the lower end portion 180b of the fourth pixel electrode 180. For example, the lower end portion 180b of the fourth pixel electrode 180 may be substantially parallel with the second inclined portion 110a_2 of the second gate line 110_2.

The second pixel electrode 160 may be disposed in the sixth sub-pixel part. The second pixel electrode 160 may include the second slit portions SL2 spaced from (e.g., spaced apart from) each other by an interval (e.g., a desired or predetermined interval). For example, the second slit portions SL2 may partially extend along the fourth direction D4. The second pixel electrode 160 may include an upper end portion 160a and a lower end portion 160b. For example, the upper end portion 160a of the second pixel electrode 160 may be substantially parallel with the first inclined portion 110a_1 of the first gate line 110_1. For example, the lower end portion 160b of the second pixel electrode 160 may be substantially parallel with the second inclined portion 110a_2 of the second gate line 110_2. For example, the upper end portion 160a of the second pixel electrode 160 may not be parallel with the lower end portion 160b of the second pixel electrode 160. An area (e.g., a surface area) of the second pixel electrode 160 may be greater (e.g., larger) than an area (e.g., a surface area) of each of the fourth pixel electrodes 180.

As mentioned above, in the present example embodiment of the invention, the pixel electrodes 150, 160, 170, and 180 may include the slit portions SL1 and SL2 extending along different directions in the first sub-pixel row PX1 and the second sub-pixel row PX2, thereby providing a wider viewing angle.

Figure 9:
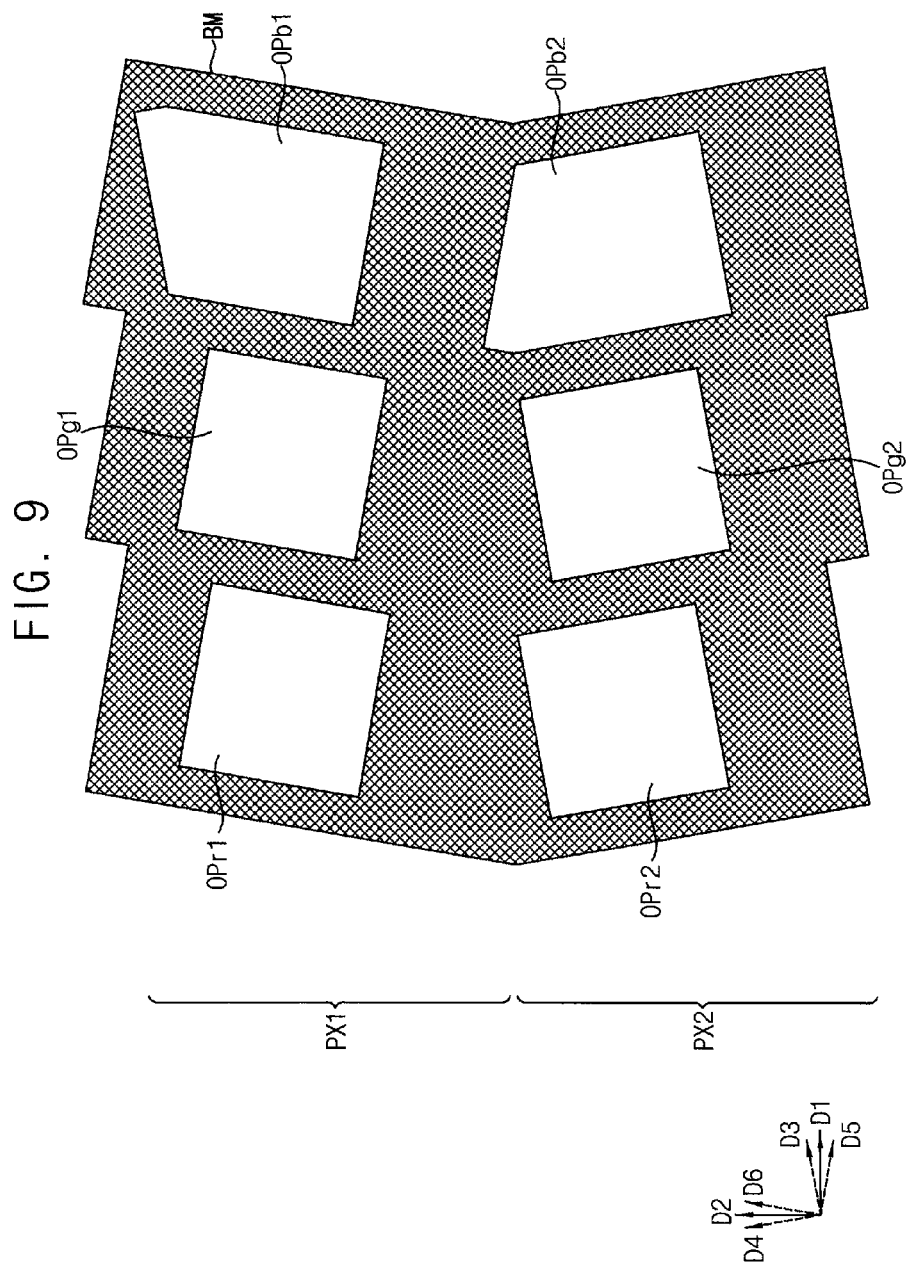
FIG. 9 is a plan view illustrating a light blocking pattern disposed on the array substrate shown in FIG. 7.

FIG. 9 is a plan view illustrating a light blocking pattern disposed on the array substrate shown in FIG. 7.

Referring to FIG. 9, a width of a light blocking pattern BM along the sixth direction D6 may be greater (e.g., longer) than a width of the light blocking pattern BM along the fifth direction D5 crossing (e.g., substantially perpendicular to) the sixth direction D6 in the first sub-pixel part, the second sub-pixel part, and the third sub-pixel part. Also, a width of the light blocking pattern BM along the fourth direction D4 may be greater (e.g., longer) than a width of the light blocking pattern BM along the third direction D3 crossing (e.g., substantially perpendicular to) the fourth direction D4 in the fourth sub-pixel part, the fifth sub-pixel part, and the sixth sub-pixel part. For example, the light blocking pattern BM may be bent or curved at or between the first sub-pixel part and the fourth sub-pixel part of the unit pixel group. Similarly, the light blocking pattern BM may be bent or curved at or between the second sub-pixel part and the fifth sub-pixel part of the unit pixel group. Similarly, the light blocking pattern BM may be bent or curved at or between the third sub-pixel part and the sixth sub-pixel part of the unit pixel group.

The light blocking pattern BM may have a first opening region OPr1 (e.g., a first opening area) and a second opening region OPg1 (e.g., a second opening area), each having a first area in the first sub-pixel part and the second sub-pixel part, respectively. The light blocking pattern BM may have a third opening region OPb1 (e.g., a third opening area) having a second area in the third sub-pixel part. The light blocking pattern BM may have a fourth opening region OPr2 (e.g., a fourth opening area) and a fifth opening region OPg2 (e.g., a fifth opening area), each having the first area in the fourth sub-pixel part and the fifth sub-pixel part, respectively. The light blocking pattern BM may have a sixth opening region OPb2 (e.g., a sixth opening area) having the second area in the sixth sub-pixel part. The second area of the third opening region OPb1 and/or the sixth opening region OPb2 may be greater (e.g., larger) than the first area of each of the first opening region OPr1, the second opening region OPg1, the fourth opening region OPr2, and the fifth opening region OPg2.

Figure 10:
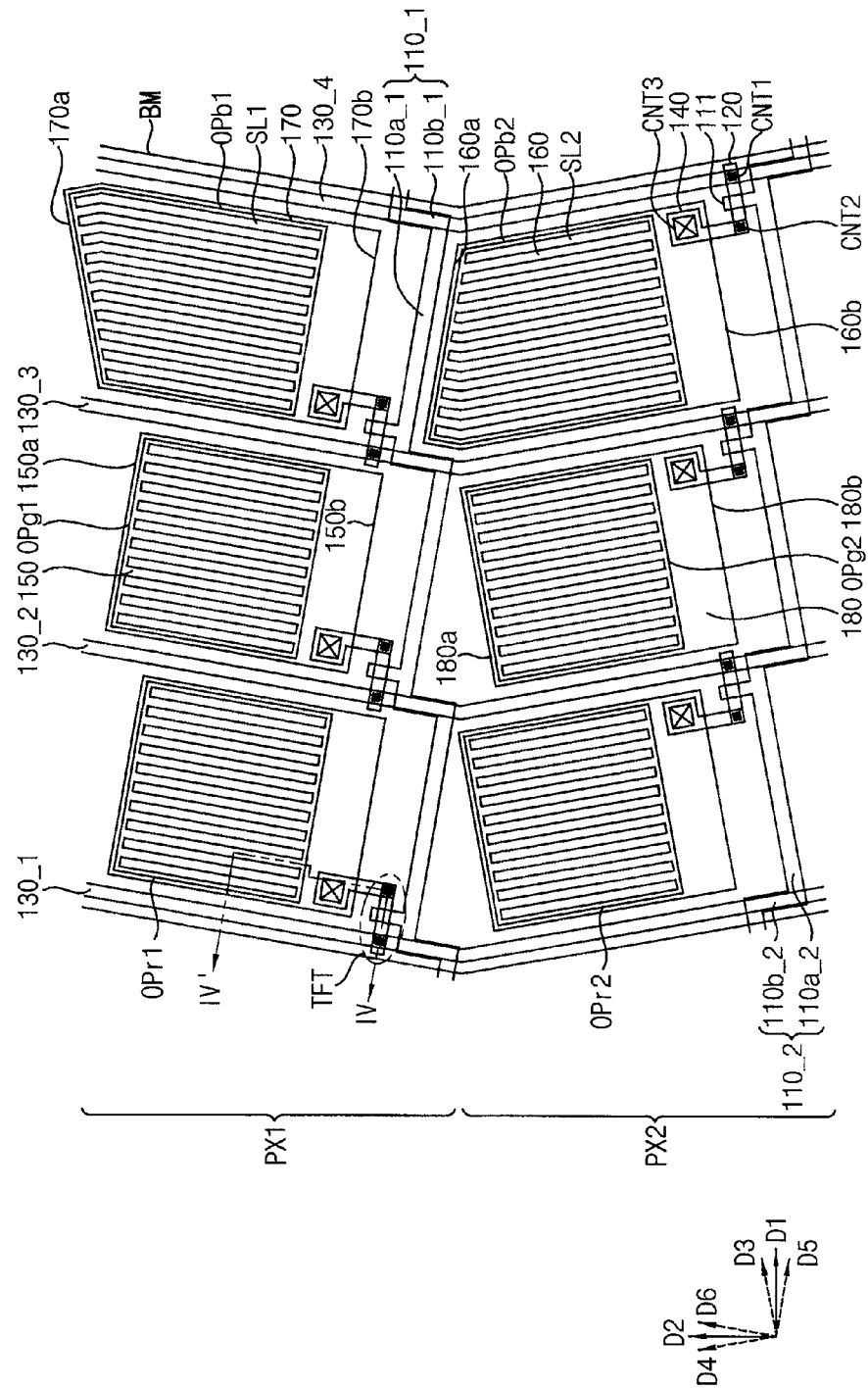
FIG. 10 is a plan view illustrating a liquid crystal display panel having the array substrate shown in FIG. 7 and the light blocking pattern shown in FIG. 9.

FIG. 10 is a plan view illustrating a liquid crystal display panel having the array substrate shown in FIG. 7 and the light blocking pattern shown in FIG. 9. FIG. 11 is a cross-sectional view taken along the line IV-IV' of FIG. 10.

Referring to FIG. 7, FIG. 8, FIG. 9, FIG. 10, and FIG. 11, a liquid crystal display panel according to the present example embodiment of the invention may include an array substrate 10, a liquid crystal layer 20, and an opposing substrate. The array substrate 10 may be substantially similar to or the same as the array substrate illustrated in FIG. 8, except that the array substrate 10 further includes a color filter pattern 310, a light blocking pattern BM, a common electrode 190, and a protection layer 195. Thus, detailed description of the identical elements may be omitted.

The color filter pattern 310 may be disposed on the first base substrate 100 on which the pixel electrodes 150, 160, 170, and 180 are disposed. The light blocking pattern BM partially overlaps the color filter pattern 310 (e.g., the light blocking pattern BM extends onto a surface of the color filter pattern 310). The color filter pattern 310 may correspond to at least one of the first to sixth opening regions OPr1, OPg1, OPb1, OPr2, OPg2, and OPb2. The color filter pattern 310 may include red, green, and blue color filter pattern. For example, the color filter pattern 310 may include a red color filter pattern corresponding to the first opening region OPr1 and the fourth opening region OPr2, a green color filter pattern corresponding to the second opening region OPg1 and the fifth opening region OPg2, and a blue color filter pattern corresponding to the third opening region OPb1 and the sixth opening region OPb2. For example, in the present example embodiment, the color filter pattern 310 may have a RGB stripe structure having a stripe format of three colors, i.e., red R, green G, and blue B. In this case, an opening region corresponding to the blue B portion of the RGB stripe structure may have a larger area than an opening region corresponding to another color portion of the RGB stripe structure. For example, an opening area of each of the third opening region OPb1 and the sixth opening region OPb2 may be larger than an opening area of each of the first opening region OPr1, the second opening region OPg1, the fourth opening region OPr2, and the fifth opening region OPg2. The opening area corresponding to the third opening region OPb1 may be substantially the same as the opening area corresponding to the sixth opening region OPb2.

The common electrode 190 may be disposed on the first base substrate 100 on which the color filter pattern 310 and the light blocking pattern BM are disposed. The common electrode 190 may be disposed on all of (e.g., an entirety of) the unit pixel group. For example, the common electrode 190 may be entirely disposed on the first to sixth sub-pixel parts.

The protection layer 195 may be disposed on the common electrode 190.

The opposing substrate may include a second base substrate 300. The second base substrate 300 may include a transparent insulation material.

As mentioned above, the liquid crystal display panel according to the present example embodiment of the invention may include sub-pixel parts having different opening areas in the unit pixel group (e.g., the sub-pixel parts may have opening areas having different or various sizes), thereby reducing a luminance decrease that occurs at an interface of the sub-pixel parts and providing a wider viewing angle.

Furthermore, an opening area corresponding to a color (e.g., blue) may be larger than an opening area corresponding to another color (e.g., red, green, etc.) in the unit pixel group, thereby improving luminance and white balance of the liquid crystal display panel.

FIGS. 12A to 12G are cross-sectional views illustrating a manufacturing method of the array substrate shown in FIG. 11.

Figure 12A:
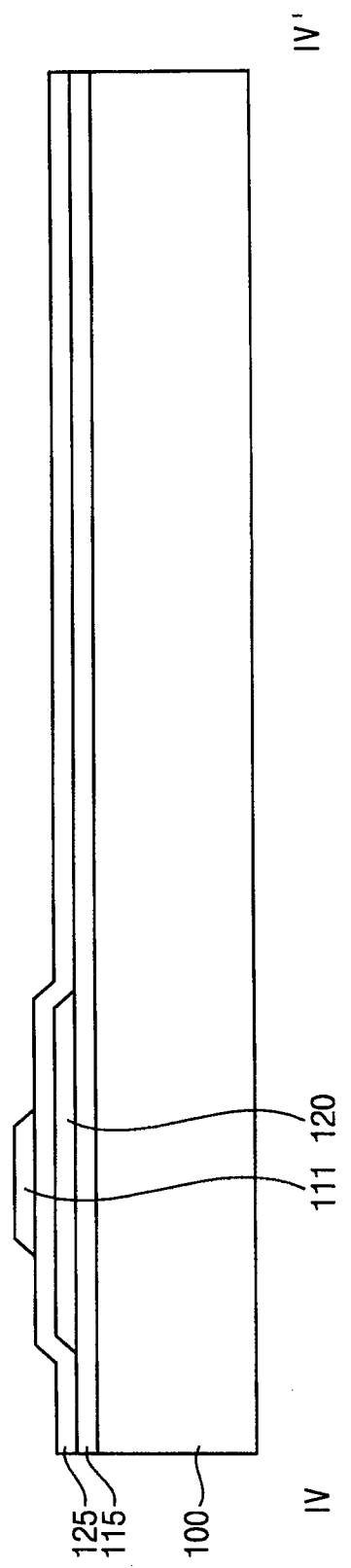
FIGS. 12A to 12G are cross-sectional views illustrating a manufacturing method of the array substrate shown in FIG. 11.

Referring to FIG. 12A, a buffer layer 115 may be formed on a first base substrate 100. A semiconductor pattern 120 may be formed on the buffer layer 115. The semiconductor pattern 120 may include, for example, a poly-crystalline silicon material. The poly-crystalline silicon material may be formed by a low temperature poly-silicon ("LTPS") process which is conducted at a temperature greater than about 300 degrees Celsius. A first insulation layer 125 may be formed on the semiconductor pattern 120 to entirely cover the semiconductor pattern 120. A gate line 110 and a gate electrode 111 may be formed on the first insulation layer 111. For example, the gate electrode 111 may be integrally formed with the gate line 110. The gate electrode 111 may overlap the semiconductor pattern 120. For example, the gate electrode 111 may overlap a central portion of the semiconductor pattern 120.

Figure 12B:
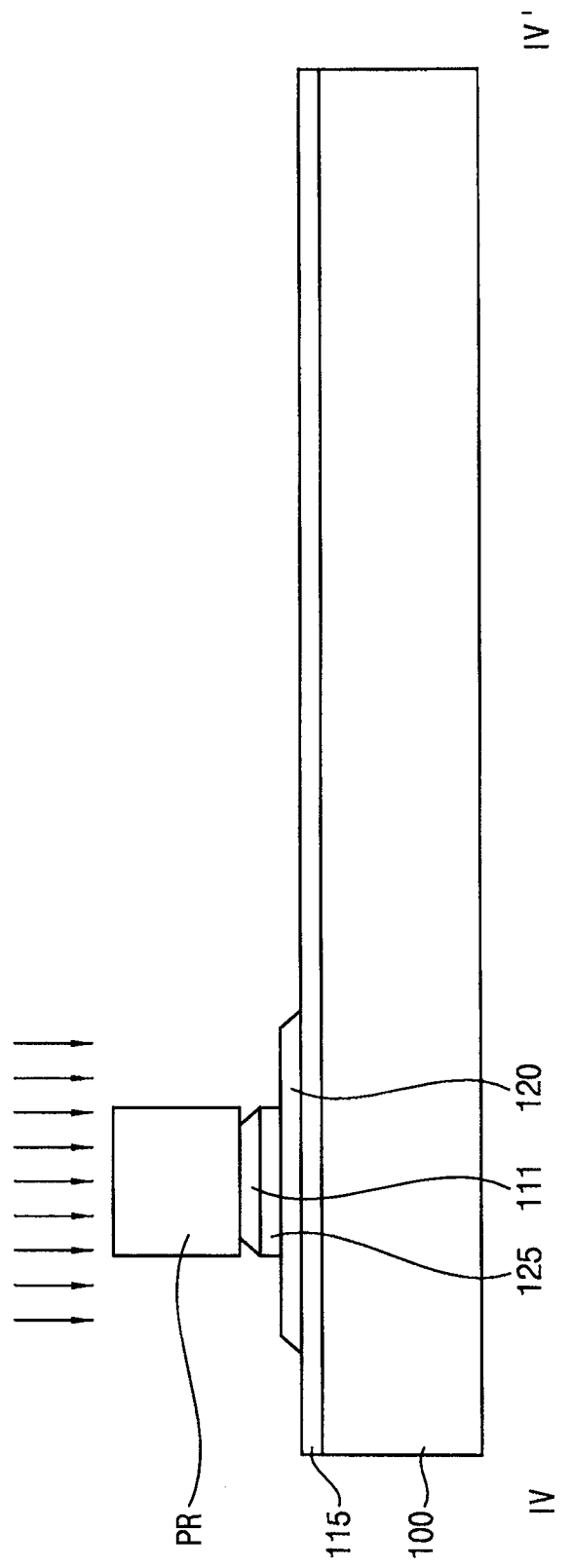

Referring to FIG. 12B, a photoresist pattern PR may be formed on the first base substrate 100 on which the gate electrode 111 is formed. The photoresist pattern PR may overlap (e.g., entirely overlap) the gate electrode 111. The photoresist pattern PR may be used as an etch mask or stopper to partially remove the first insulation layer 125. For example, end portions of the semiconductor pattern 120 may be exposed by the partial removal of the first insulation layer 125. Positive n ions (n+ ions) may be doped on the semiconductor pattern 120 (e.g., on the portions of the semiconductor pattern 120) on which the photoresist pattern PR is disposed.

Figure 12C:
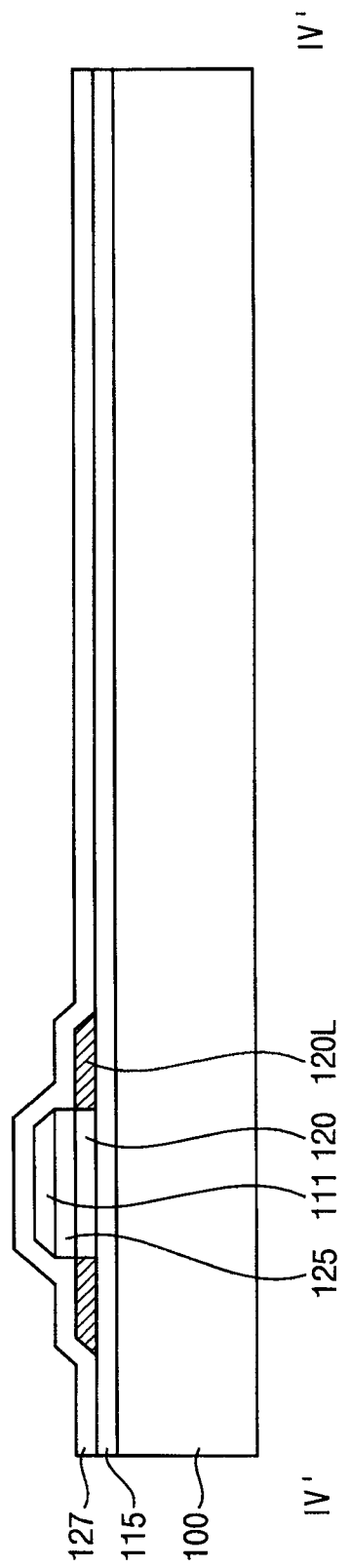

Referring to FIG. 12C, lightly doped drain regions 120L may be formed at the end portions of the semiconductor pattern 120 due to the ion doping. A second insulation layer 127 may be formed on the first base substrate 100 on which the lightly doped drain regions 120L are formed.

Figure 12D:
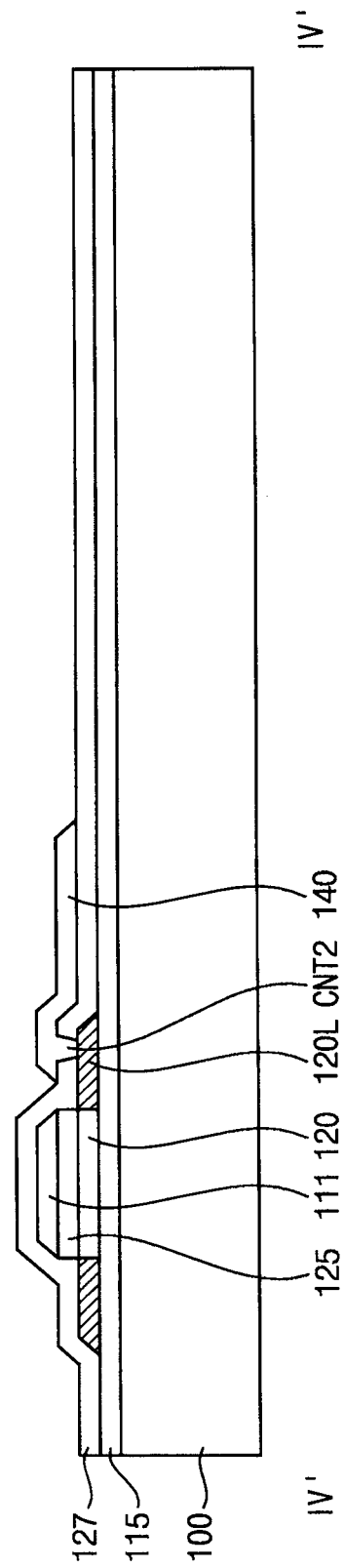

Referring to FIG. 12D, a second contact opening CNT2 (e.g., a second contact hole) may be formed in the second insulation layer 127 to expose a portion of one of the lightly doped drain regions 120L. A drain electrode pattern 140 may be formed at the second contact opening CNT2 to contact the semiconductor pattern 120.

Figure 12E:
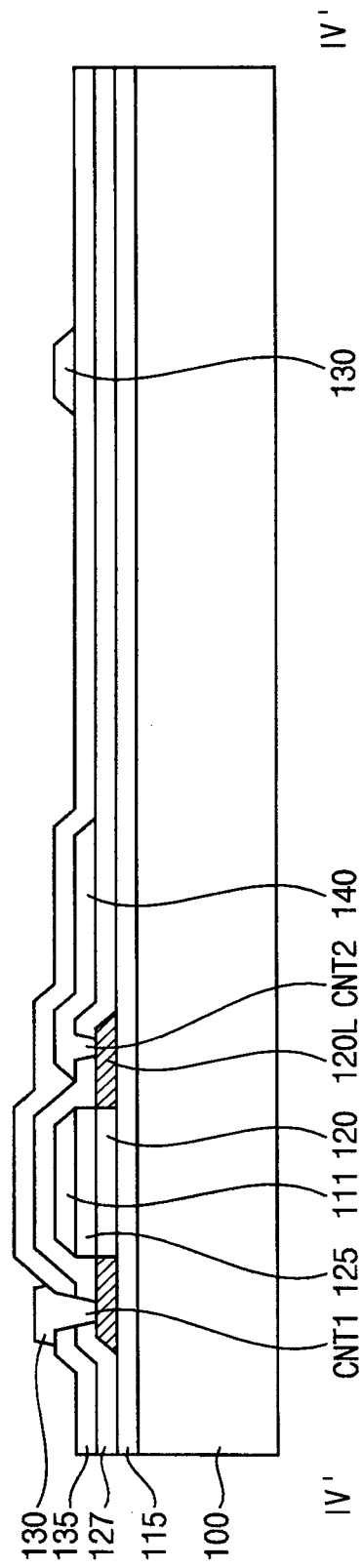

Referring to FIG. 12E, a third insulation layer 135 may be formed on the first base substrate 100 on which the drain electrode pattern 140 is formed. A first contact opening CNT1 (e.g., a first contact hole) may be formed in the second insulation layer 127 and the third insulation layer 135 to expose a portion of an other of the lightly doped drain regions 120L. A data line 130 may be formed at the first contact opening CNT1 to contact the semiconductor pattern 120. The data line 130 may be bent or curved in a unit pixel group in a plan view (e.g., the data line 130 may be bent or curved at or between the first and second sub-pixel rows PX1 and PX2).

Figure 12F:
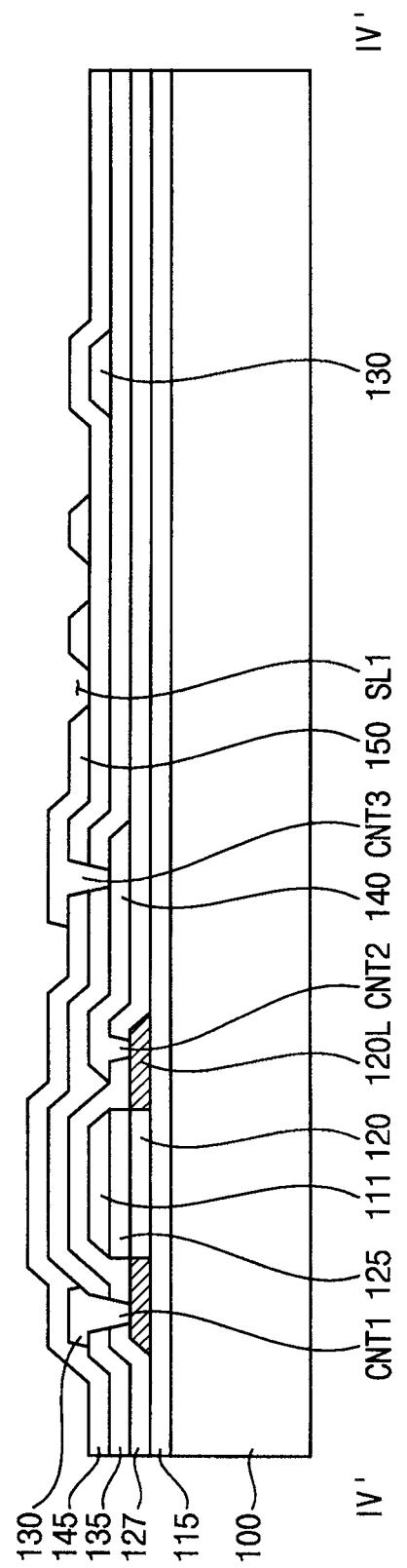

Referring to FIG. 12F, a passivation layer 145 may be formed on the first base substrate 100 on which the data line 130 is formed. A third contact opening CNT3 (e.g., a third contact hole) may be formed in the passivation layer 145 and the third insulation layer 135 to partially expose the drain electrode pattern 140. A pixel electrode 150 may be formed at the third contact opening CNT3 to contact the drain electrode pattern 140. The pixel electrode 150 may include a plurality of slit portions SL1.

Figure 12G:
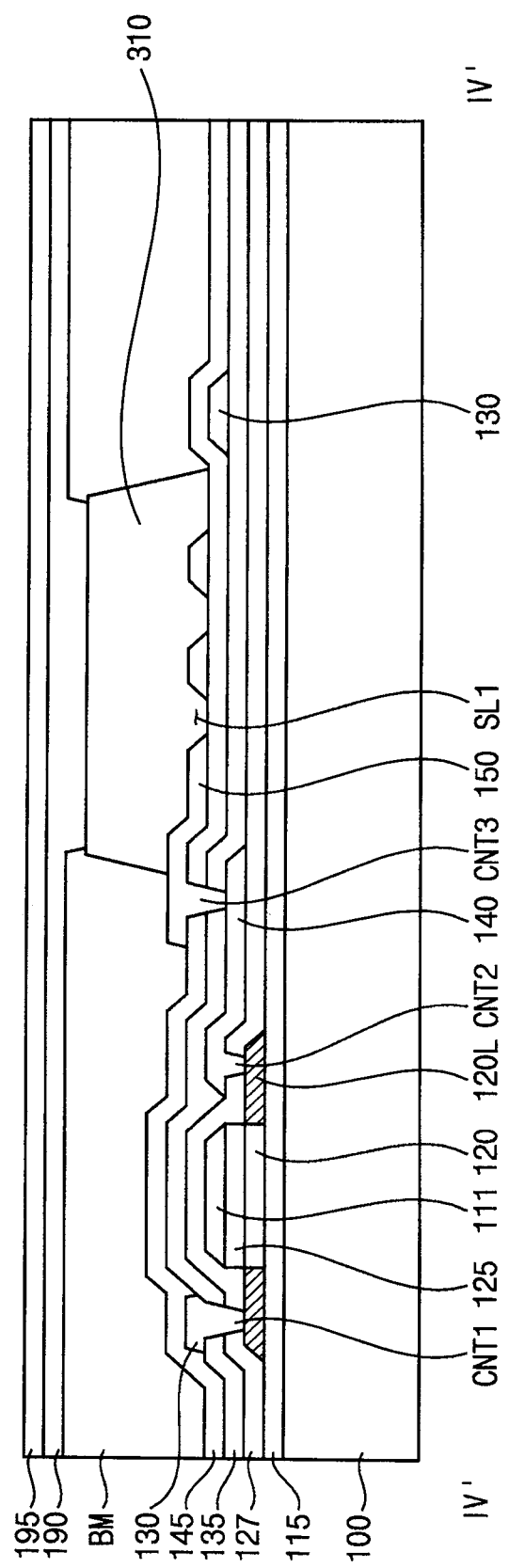

Referring to FIG. 12G, a color filter pattern 310 may be formed on the first base substrate 100 on which the pixel electrode 150 is formed. The color filter pattern 310 may include a red, green, or blue filter pattern. The color filter pattern 310 overlaps (e.g., partially overlaps) the pixel electrode 150. A light blocking pattern BM may be formed on the first base substrate 100 to overlap end portions of the color filter pattern 310. A first opening region OPr1 of the light blocking pattern BM may partially expose the color filter pattern 310. A common electrode 190 and a protection layer 195 may be sequentially formed on the first base substrate 100 on which the color filter pattern 310 and the light blocking pattern BM are formed.

As mentioned above, according to one or more example embodiment of the array substrate and the liquid crystal display panel having the same, the unit pixel group arranged in a matrix shape may include the data fine and the gate line extending in a zigzag shape with respect to an arrangement direction of the unit pixel group (e.g., extending along the arrangement direction of the unit pixel group in a zigzag shape), thereby providing a wider viewing angle.

Also, the data line may be disposed in a different layer than the drain electrode pattern, thereby reducing the gap (e.g., the horizontal gap) between the data line and the drain electrode pattern and increasing display resolution of the liquid crystal display panel.

Also, opening areas of the sub-pixel parts divided by one of the data lines or gate lines may be different from each other in the unit pixel group (e.g., sizes of the opening areas of the sub-pixel parts may be different or vary), thereby reducing a luminance decrease generated at boundaries between the sub-pixel parts.

Furthermore, an opening area of one of the sub-pixel parts transmitting a first color light may be greater (e.g., larger) than an opening area of another sub-pixel part transmitting a second color light different from the first color light, thereby improving luminance and white balance of the liquid crystal display panel.

The foregoing is illustrative of example embodiments of the present invention and is not to be construed as limiting thereof. Although a few example embodiments have been described herein, those skilled in the art will readily appreciate that many modifications are possible in these example embodiments without materially departing from the novel teachings and advantages of the present invention. Accordingly, all such modifications are intended to be included within the scope of example embodiments as defined in the claims and their equivalents. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims and their equivalents.

What is claimed is:

1. An array substrate comprising a unit pixel group having a first sub-pixel row and a second sub-pixel row adjacent to the first sub-pixel row, the array substrate comprising:
   a plurality of gate lines extending along a first direction and adjacent to each other on a base substrate;
   a plurality of gate electrodes electrically coupled to the gate lines, respectively;
   a plurality of semiconductor patterns overlapping the gate electrodes, respectively;
   a plurality of data lines extending along a second direction and electrically coupled to first portions of the semiconductor patterns, respectively, the second direction crossing the first direction;
   a plurality of drain electrode patterns electrically coupled to second portions of the semiconductor patterns, respectively, the second portion of the semiconductor pattern being spaced from the first portion of the semiconductor pattern; and
   a plurality of pixel electrodes electrically coupled to the drain electrodes, respectively,
   wherein each of the gate lines and each of the data lines are bent, and
   wherein sub-pixels in the first sub-pixel row have opening areas that are different in size than that of sub-pixels in the second sub-pixel row.

2. The array substrate of claim 1, wherein the semiconductor patterns comprise a poly-crystalline silicon material.

3. The array substrate of claim 1, wherein the second direction is substantially perpendicular to the first direction, and the gate lines comprise:
   a first gate line extending along the first direction in a first zigzag shape; and
   a second gate line extending along the first direction in a second zigzag shape, the second zigzag shape being substantially symmetrical to the first zigzag shape with respect to the second direction.

4. The array substrate of claim 3, wherein the first gate line comprises a first inclined portion extending along a third direction tilted from the first direction and a first connecting portion connected to the first inclined portion, and
   wherein the second gate line comprises a second inclined portion extending along a fourth direction tilted from the first direction and a second connecting portion connected to the second inclined portion, the fourth direction being opposite to the third direction with respect to the first direction.

5. The array substrate of claim 3, wherein the pixel electrodes in the first sub-pixel row are electrically coupled to the data lines at a first side along the first direction, and
   wherein the pixel electrodes in the second sub-pixel row are electrically coupled to the data lines at a second side along the first direction, the second side being opposite to the first side with respect to the second direction.

6. The array substrate of claim 3, wherein the data lines in the first sub-pixel row extend along a fifth direction tilted from the second direction, and
   wherein the data lines in the second sub-pixel row extend along a sixth direction tilted from the second direction, the sixth direction being opposite to the fifth direction with respect to the first direction.

7. The array substrate of claim 1, wherein the drain electrode patterns are in layers different than layers the data lines are in.

8. The array substrate of claim 7 further comprising:
   an insulation layer between the drain electrode patterns and the data lines.

9. The array substrate of claim 8, wherein the insulation layer covers the drain electrode patterns, and
   wherein the data lines contact the first portions of the semiconductor patterns through first contact openings in the insulation layer, respectively.

10. The array substrate of claim 8, wherein the insulation layer covers the data lines, and
    wherein the drain electrode patterns contact the second portions of the semiconductor patterns through second contact openings in the insulation layer, respectively.

11. The array substrate of claim 1, wherein the pixel electrodes comprise a plurality of slit portions, the slit portions in the first sub-pixel row extend along a direction different than a direction the slit portions in the second sub-pixel row extend.

12. A liquid crystal display panel comprising:
    an array substrate comprising a unit pixel group comprising a first sub-pixel row and a second sub-pixel row adjacent to the first sub-pixel row, the array substrate comprising:
    a plurality of gate lines extending along a first direction and adjacent to each other on a base substrate;

a plurality of gate electrodes electrically coupled to the gate lines, respectively;

a plurality of semiconductor patterns overlapping the gate electrodes, respectively;

a plurality of data lines extending along a second direction and electrically coupled to first portions of the semiconductor patterns, respectively, the second direction crossing the first direction;

a plurality of drain electrode patterns electrically coupled to second portions of the semiconductor patterns, respectively, the second portions of the semiconductor patterns being spaced from the first portions of the respective semiconductor patterns; and a plurality of pixel electrodes electrically coupled to the drain electrodes, respectively;

an opposing substrate facing the array substrate; and a liquid crystal layer between the array substrate and the opposing substrate, wherein each of the gate lines and each of the data lines are bent, and wherein sub-pixels in the first sub-pixel row have opening areas that are different in size than that of sub-pixels in the second sub-pixel row.

13. The liquid crystal display panel of claim 12, wherein the second direction is substantially perpendicular to the first direction, and the gate lines comprise:

a first gate line extending along the first direction in a first zigzag shape; and a second gate line extending along the first direction in a second zigzag shape, the second zigzag shape being substantially symmetrical to the first zigzag shape with respect to the second direction.

14. The liquid crystal display panel of claim 13 further comprising:

a plurality of color filter patterns overlapping the pixel electrodes, respectively; and a light blocking pattern overlapping the gate lines, the gate electrodes, the semiconductor patterns, and the data lines.

15. The liquid crystal display panel of claim 14, wherein the light blocking pattern comprises a plurality of opening regions overlapping the pixel electrodes, respectively, and areas of at least two of the opening regions are different from each other.

16. The liquid crystal display panel of claim 15, wherein the color filter patterns comprise a red filter pattern, a green filter pattern, and a blue filter pattern.

17. The liquid crystal display panel of claim 16, wherein the color filter patterns have one of a RGB stripe format or a PenTile format, and the opening region corresponding to the blue filter pattern is greater in size than that of each of the red filter pattern and the green filter pattern.

18. The liquid crystal display panel of claim 17, wherein the color filter patterns have the PenTile format, and the pixel electrodes comprise first and second pixel electrodes in the first sub-pixel row arranged along the first direction and third and fourth pixel electrodes in the second sub-pixel row arranged along the first direction, and wherein at least one of the third pixel electrode and the fourth pixel electrode is greater in size than that of each of the first pixel electrode and the second pixel electrode.

19. The liquid crystal display panel of claim 17, wherein the color filter patterns have the RGB stripe format, and the pixel electrodes comprise first, second, and third pixel electrodes in the first sub-pixel row arranged along the first direction and fourth, fifth, and sixth pixel electrodes in the second sub-pixel row arranged along the first direction, and wherein at least one of the third pixel electrode and the sixth pixel electrode is greater in size than that of each of the first, second, fourth, and fifth pixel electrodes.

20. The liquid crystal display panel of claim 14, wherein the color filter patterns and the light blocking pattern are on the array substrate.

* * * * *